(12) United States Patent
Feng et al.

(10) Patent No.: US 12,538,672 B2
(45) Date of Patent: Jan. 27, 2026

(54) DISPLAY SUBSTRATE AND PREPARATION METHOD THEREFOR, AND DISPLAY APPARATUS

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 505 days.

(21) Appl. No.: 18/026,344

(22) PCT Filed: May 19, 2022

(86) PCT No.: PCT/CN2022/093857
§ 371 (c)(1),
(2) Date: Mar. 14, 2023

(87) PCT Pub. No.: WO2023/221040
PCT Pub. Date: Nov. 23, 2023

(65) Prior Publication Data
US 2024/0306442 A1   Sep. 12, 2024

(51) Int. Cl.
*H10K 59/131*   (2023.01)
*H10K 59/12*   (2023.01)

(52) U.S. Cl.
CPC ....... *H10K 59/131* (2023.02); *H10K 59/1201* (2023.02)

(58) Field of Classification Search
CPC .................. H10K 59/131; H10K 59/1201
See application file for complete search history.

(56) References Cited

U.S. PATENT DOCUMENTS

| | | |
|---|---|---|
| 2012/0256183 A1 | 10/2012 | Zhang |
| 2016/0293771 A1 | 10/2016 | Long et al. |
| 2017/0186784 A1 | 6/2017 | Yang et al. |
| 2021/0013299 A1 | 1/2021 | Okabe et al. |
| 2021/0202603 A1* | 7/2021 | Wu ............... H10D 86/60 |

FOREIGN PATENT DOCUMENTS

| | | |
|---|---|---|
| CN | 102645801 A | 8/2012 |
| CN | 104253159 A | 12/2014 |
| CN | 104851789 B | 5/2018 |

* cited by examiner

*Primary Examiner* — Douglas M Menz
(74) *Attorney, Agent, or Firm* — Ling Wu; Stephen Yang; Ling and Yang Intellectual Property

(57) ABSTRACT

Disclosed are a display substrate and a preparation method therefor, and a display apparatus. The display substrate includes a plurality of sub-pixels, wherein at least one sub-pixel includes a pixel drive circuit, the pixel drive circuit is respectively connected with a scan signal line (41, 42) and a first power supply line (60); and in at least one sub-pixel, the scan signal line (41, 42) is provided with at least one fracture (K1, K2), scan signal lines (41, 42) on both sides of the fracture (K1, K2) are connected with each other through a signal connection electrode (91, 92), a length of the signal connection electrode (91, 92) is larger than a width of the first power supply line (60), and the length of the signal connection electrode (91, 92) is smaller than a width of the sub-pixel.

20 Claims, 22 Drawing Sheets

DISPLAY SUBSTRATE AND PREPARATION METHOD THEREFOR, AND DISPLAY APPARATUS

CROSS-REFERENCE TO RELATED APPLICATION

The present application is a U.S. National Phase Entry of International Application No. PCT/CN2022/093857 having an international filing date of May 19, 2022. The entire contents of the above-identified application are hereby incorporated by reference.

TECHNICAL FIELD

The present disclosure relates to, but is not limited to, the field of display technologies, and in particular to a display substrate and a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With continuous development of display technologies, a display apparatus using an OLED or a QLED as a light emitting device and using a Thin Film Transistor (TFT) for signal control has become a mainstream product in the field of display at present.

SUMMARY

The following is a summary of subject matters described herein in detail. The summary is not intended to limit the protection scope of claims.

In one aspect, the present disclosure provides a display substrate including a plurality of sub-pixels, wherein at least one sub-pixel includes a pixel drive circuit, the pixel drive circuit is connected with a scan signal line extending along a first direction and a first power supply line extending along a second direction, the scan signal line is configured to provide a scan signal to the pixel drive circuit, the first power supply line is configured to provide a power supply signal to the pixel drive circuit, and the first direction intersects with the second direction; and in at least one sub-pixel, the scan signal line is provided with at least one fracture that cuts off the scan signal line, scan signal lines on both sides of the fracture are connected with each other through a signal connection electrode, a length of the signal connection electrode is larger than a width of the first power supply line, and the length of the signal connection electrode is smaller than a width of the sub-pixel, wherein the length is a dimension of the signal connection electrode in the first direction, the width is a dimension of the first power supply line in the first direction, and the width of the sub-pixel is a dimension of the sub-pixel in the first direction X.

In an exemplary implementation mode, the scan signal line includes a first scan signal line that provides a first scan signal to the pixel drive circuit, the fracture includes a first fracture that cuts off the first scan signal line, the signal connection electrode includes a first signal connection electrode, a first end of the first signal connection electrode is connected with a first scan signal line on one side of the first fracture through a via, a second end of the first signal connection electrode is connected with a first scan signal line on the other side of the first fracture through a via, a length of the first signal connection electrode is larger than the width of the first power supply line, and the length of the first signal connection electrode is smaller than the width of the sub-pixel.

In an exemplary implementation mode, the plurality of sub-pixels include a first sub-pixel, a second sub-pixel, a third sub-pixel, and a fourth sub-pixel which are arranged sequentially along the first direction, wherein the first fracture and the first signal connection electrode are arranged within the first sub-pixel, or the first fracture and the first signal connection electrode are arranged within the second sub-pixel, or the first fracture and the first signal connection electrode are arranged within the third sub-pixel, or the first fracture and the first signal connection electrode are arranged within the fourth sub-pixel.

In an exemplary implementation mode, on a plane perpendicular to the display substrate, the display substrate includes a plurality of conductive layers, the first signal connection electrode and the first power supply line are arranged in a same conductive layer, and the first scan signal line and the first power supply line are arranged in different conductive layers.

In an exemplary implementation mode, the scan signal line includes a second scan signal line that provides a second scan signal to the pixel drive circuit, the fracture includes a second fracture that cuts off the second scan signal line, the signal connection electrode includes a second signal connection electrode, a first end of the second signal connection electrode is connected with a second scan signal line on one side of the second fracture through a via, a second end of the second signal connection electrode is connected with a second scan signal line on the other side of the second fracture through a via, a length of the second signal connection electrode is larger than the width of the first power supply line, and the length of the second signal connection electrode is smaller than the width of the sub-pixel.

In an exemplary implementation mode, on a plane perpendicular to the display substrate, the display substrate includes a plurality of conductive layers, the second signal connection electrode and the first power supply line are arranged in a same conductive layer, and the second scan signal line and the first power supply line are arranged in different conductive layers.

In an exemplary implementation mode, the pixel drive circuit is further connected with a compensation signal line, and the compensation signal line is configured to provide a compensation signal to the pixel drive circuit; in at least one sub-pixel, the compensation signal line at least includes a compensation connection electrode, and a first compensation signal line and a second compensation signal line which are arranged at intervals, wherein a first end of the compensation connection electrode is connected with the first compensation signal line through a via, and a second end of the compensation connection electrode is connected with the second compensation signal line through a via.

In an exemplary implementation mode, an orthographic projection of the compensation connection electrode on the display substrate is at least partially overlapped with an orthographic projection of the second fracture on the display substrate.

In an exemplary implementation mode, an orthographic projection of the compensation connection electrode on the display substrate is at least partially overlapped with an orthographic projection of the second signal connection electrode on the display substrate.

In an exemplary implementation mode, at least one through hole is provided on the second signal connection electrode and an orthographic projection of the through hole on the display substrate is at least partially overlapped with an orthographic projection of the compensation connection electrode on the display substrate.

In an exemplary implementation mode, the plurality of sub-pixels include a first sub-pixel, a second sub-pixel, a third sub-pixel, and a fourth sub-pixel arranged sequentially along the first direction, wherein the first compensation signal line, the second compensation signal line, and the compensation connection electrode are arranged between the second sub-pixel and the third sub-pixel.

In an exemplary implementation mode, the scan signal line includes a second scan signal line that provides a second scan signal to the pixel drive circuit, the fracture includes a second fracture that cuts off the second scan signal line, and the signal connection electrode includes a third signal connection electrode, a fourth signal connection electrode, and a fifth signal connection electrode, wherein a first end of the third signal connection electrode and a second scan signal line on one side of the second fracture are respectively connected with the fourth signal connection electrode through vias, a second end of the third signal connection electrode and a second scan signal line on the other side of the second fracture are respectively connected with the fifth signal connection electrode through vias, a length of the third signal connection electrode is larger than the width of the first power supply line, and the length of the third signal connection electrode is smaller than the width of the sub-pixel.

In an exemplary implementation mode, on a plane perpendicular to the display substrate, the display substrate includes a plurality of conductive layers, the fourth signal connection electrode, the fifth signal connection electrode, and the first power supply line are arranged in a same conductive layer, and the second scan signal line and the first power supply line are arranged in different conductive layers.

In an exemplary implementation mode, the plurality of sub-pixels include a first sub-pixel, a second sub-pixel, a third sub-pixel, and a fourth sub-pixel which are arranged sequentially along the first direction, wherein the fourth signal connection electrode is arranged within the second sub-pixel, and the fifth signal connection electrode is arranged within the third sub-pixel.

In an exemplary implementation mode, the scan signal line includes a first scan signal line providing a first scan signal to the pixel drive circuit and a second scan signal line providing a second scan signal to the pixel drive circuit, the fracture includes a first fracture that cuts off the first scan signal line and a second fracture that cuts off the second scan signal line, and the signal connection electrode includes a first signal connection electrode and a second signal connection electrode, wherein the first signal connection electrode is respectively connected with first signal connection electrodes on both sides of the first fracture through vias, and the second signal connection electrode is respectively connected with second signal connection electrodes on both sides of the second fracture through vias.

In an exemplary implementation mode, the pixel drive circuit at least includes a storage capacitor; and on a plane perpendicular to the display substrate, the display substrate includes a transparent conductive layer, a first conductive layer, a semiconductor layer, a second conductive layer, and a third conductive layer arranged sequentially on a base substrate, wherein the transparent conductive layer at least includes a first electrode plate of the storage capacitor, the semiconductor layer at least includes a second electrode plate of the storage capacitor, the second conductive layer at least includes the scan signal line, the third conductive layer at least includes the first power supply line, the signal connection electrode is arranged in the third conductive layer, or the signal connection electrode is respectively arranged in the first conductive layer and the third conductive layer.

In an exemplary implementation mode, the scan signal line includes a first scan signal line, and the signal connection electrode includes a first signal connection electrode, wherein the first scan signal line is arranged in the second conductive layer, and the first signal connection electrode is arranged in the third conductive layer.

In an exemplary implementation mode, the scan signal line includes a second scan signal line, and the signal connection electrode includes a second signal connection electrode, wherein the second scan signal line is arranged in the second conductive layer, and the second signal connection electrode is arranged in the third conductive layer.

In an exemplary implementation mode, the first conductive layer further includes a compensation connection electrode, and the third conductive layer further includes a first compensation signal line and a second compensation signal line.

In an exemplary implementation mode, the scan signal line includes a second scan signal line, and the signal connection electrode includes a third signal connection electrode, a fourth signal connection electrode, and a fifth signal connection electrode, wherein the second scan signal line is arranged in the second conductive layer, the third signal connection electrode is arranged in the first conductive layer, and the fourth signal connection electrode and the fifth signal connection electrode are arranged in the third conductive layer.

In another aspect, the present disclosure also provides a display apparatus, including the aforementioned display substrate.

In yet another aspect, the present disclosure also provides a preparation method of a display substrate, wherein the display substrate includes a plurality of sub-pixels, and the preparation method includes: forming a pixel drive circuit in at least one sub-pixel, wherein the pixel drive circuit is connected with a scan signal line extending along a first direction and a first power supply line extending along a second direction, the scan signal line is configured to provide a scan signal to the pixel drive circuit, the first power supply line is configured to provide a power supply signal to the pixel drive circuit, and the first direction intersects with the second direction; the scan signal line is provided with at least one fracture that cuts off the scan signal line, the scan signal lines on both sides of the fracture are connected with each other through a signal connection electrode, a length of the signal connection electrode is larger than a width of the first power supply line, the length of the signal connection electrode is smaller than a width of the sub-pixel, the length is a dimension of the signal connection electrode in the first direction, the width is a dimension of the first power supply line in the first direction, and the width of the sub-pixel is a dimension of the sub-pixel in the first direction X.

Other aspects may be understood after reading and understanding drawings and detailed description.

BRIEF DESCRIPTION OF DRAWINGS

The drawings are intended to provide a further understanding of technical solutions of the present disclosure and constitute a part of the specification, and are used for explaining the technical solutions of the present disclosure together with embodiments of the present disclosure, and not intended to constitute limitations on the technical solutions of the present disclosure. Shapes and sizes of various components in the drawings do not reflect actual scales, but are only intended to schematically illustrate contents of the present disclosure.

Figure 1:
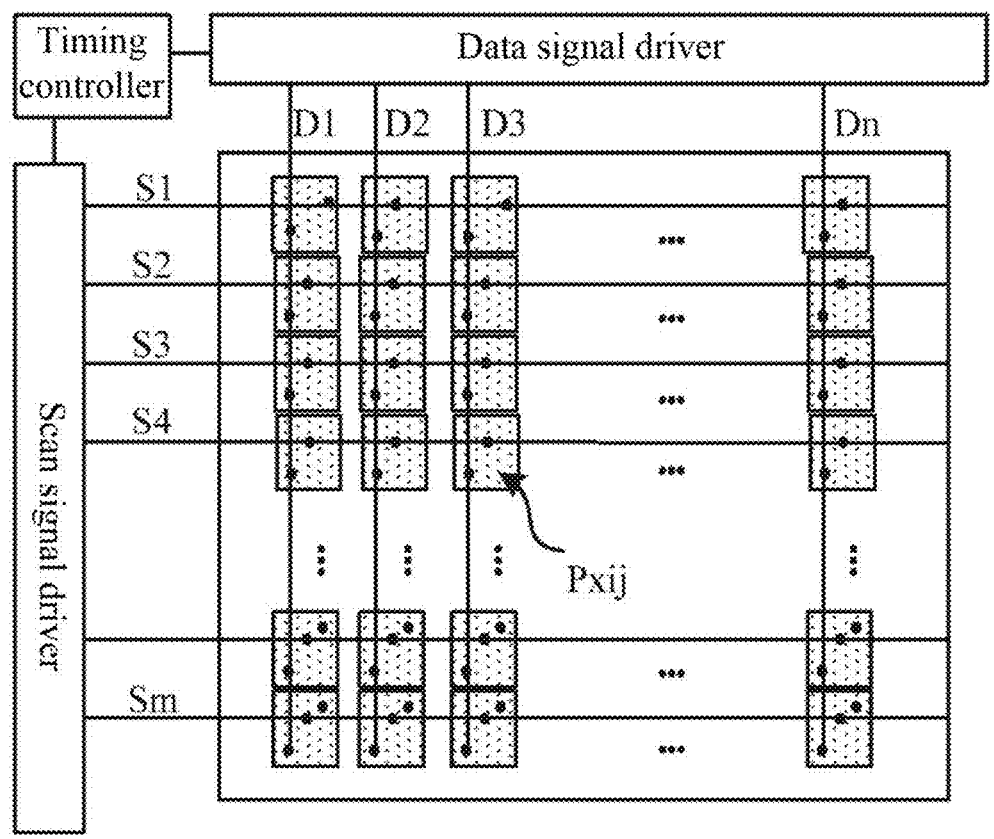
FIG. 1 is a schematic diagram of a structure of a display apparatus.

Reference signs are described as follows.

| | | |
|---|---|---|
| 11-first electrode plate; | 12-connection plate; | 13-connection line; |
| 21-power connection line; | 22-compensation connection line; | 23-shield layer; |
| 24-interlayer connection electrode; | 31-first active layer; | 32-second active layer; |
| 33-third active layer; | 34-second electrode plate; | 41-first scan signal line; |
| 42-second scan signal line; | 43-second gate electrode; | 44-auxiliary power supply line; |
| 45-auxiliary data line; | 46-auxiliary compensation line; | 51-first connection electrode; |
| 52-second connection electrode; | 53-third connection electrode; | 54-fourth connection electrode; |
| 55-fifth connection electrode; | 56-sixth connection electrode; | 60-first power supply line; |
| 70-data signal line; | 80-compensation signal line; | 81-first compensation signal line; |
| 82-second compensation signal line; | 83-compensation connection electrode; | 91-first signal connection electrode; |
| 92-second signal connection electrode; | 93-third signal connection electrode; | 94-fourth signal connection electrode; |
| 95-fifth signal connection electrode; | 101-base substrate; | 102-drive circuit layer; |
| 103-light emitting structure layer; | 104-encapsulation structure layer; | 301-anode; |
| 302-pixel definition layer; | 303-organic emitting layer; | 304-cathode; |
| 401-first encapsulation layer; | 402-second encapsulation layer; | 403-third encapsulation layer. |

DETAILED DESCRIPTION

To make objectives, technical solutions, and advantages of the present disclosure clearer, the embodiments of the present disclosure will be described in detail with reference to the accompanying drawings. Implementation modes may be implemented in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

A scale of the drawings in the present disclosure may be used as a reference in an actual process, but is not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientations or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; may be a mechanical connection or an electrical connection; may be a direct mutual connection, or an indirect connection through middleware, or communication inside two elements. Those of ordinary skill in the art may understand specific meanings of these terms in the present disclosure according to specific situations.

In the specification, a transistor refers to an element which includes at least three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, a first electrode may be a source electrode, and a second electrode may be a drain electrode. In a case that transistors with opposite polarities are used, or a case that a direction of a current is changed during operation of a circuit, or the like, functions of the "source electrode" and the "drain electrode" are sometimes interchangeable. Therefore, the "source electrode" and the "drain electrode" are interchangeable, and a "source terminal" and a "drain terminal" are interchangeable in the specification.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, and other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in the specification is not strictly defined, and they may be an approximate triangle, rectangle, trapezoid, pentagon, or hexagon, etc. There may be some small deformation caused by tolerance, and there may be a chamfer, an arc edge, and deformation, etc.

In the present disclosure, "about" refers to that a boundary is not defined so strictly and numerical values within process and measurement error ranges are allowed.

FIG. 1 is a schematic diagram of a structure of a display apparatus. As shown in FIG. 1, the display apparatus may include a timing controller, a data driver, a scan driver, and a pixel array. The timing controller is connected with the data driver and the scan driver respectively, the data driver is connected with a plurality of data signal lines (D1 to Dn) respectively, and the scan driver is connected with a plurality of scan signal lines (S1 to Sm) respectively. The pixel array may include a plurality of sub-pixels Pxij, wherein i and j may be natural numbers. At least one sub-pixel Pxij may include a circuit unit and a light emitting device connected with the circuit unit, wherein the circuit unit may include a pixel drive circuit which is connected with a scan signal line and a data signal line. In an exemplary implementation mode, the timing controller may provide a gray scale value and a control signal suitable for the specification of the data driver to the data driver, and may provide a clock signal, a scan start signal, and the like suitable for the specification of the scan driver to the scan driver. The data driver may generate a data voltage to be provided to the data signal lines D1, D2, D3, . . . , and Dn by using the gray scale value and the control signal that are received from the timing controller. For example, the data driver may sample the gray scale value by using a clock signal, and apply a data voltage corresponding to the gray scale value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number.

Figure 2:
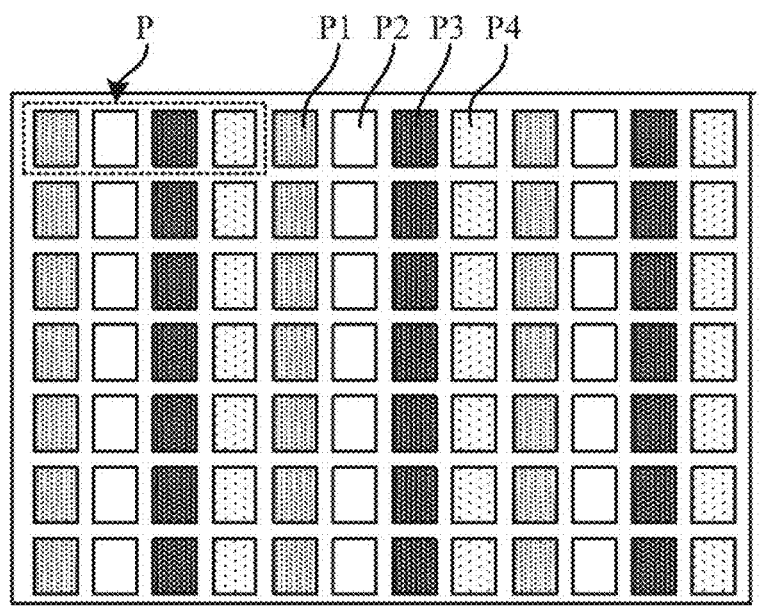
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix manner, wherein at least one of the plurality of pixel units P may include a first sub-pixel P1 emitting light of a first color, a second sub-pixel P2 emitting light of a second color, a third sub-pixel P3 emitting light of a third color, and a fourth sub-pixel P4 emitting light of a fourth color. Each of the four sub-pixels may include a circuit unit and a light emitting device, wherein the circuit unit may include a pixel drive circuit which is respectively connected with a scan signal line and a data signal line, and the pixel drive circuit is configured to receive a data voltage transmitted by the data signal line and output a corresponding current to the light emitting device under control of the scan signal line. The light emitting device in each pixel unit is connected with a pixel drive circuit of a sub-pixel where the light emitting device is located, and the light emitting device is configured to emit light with corresponding brightness in response to a current output by the pixel drive circuit of the sub-pixel where the light emitting device is located.

In an exemplary implementation mode, the first sub-pixel P1 may be a Red sub-pixel (R) emitting red light, the second sub-pixel P2 may be a White sub-pixel (W) emitting white light, the third sub-pixel P3 may be a Blue sub-pixel (B) emitting blue light, and the fourth sub-pixel P4 may be a Green sub-pixel (G) emitting green light.

In an exemplary implementation mode, a shape of a sub-pixel may be a rectangle, a rhombus, a pentagon, or a hexagon. In an exemplary implementation mode, four sub-pixels may be arranged in a manner to stand side by side horizontally to form an RWBG pixel arrangement. In another exemplary implementation mode, the four sub-pixels may be arranged in manner to form a square, in a manner to form a diamond, in a manner to stand side by side vertically, or the like, which is not limited here in the present disclosure.

In an exemplary implementation mode, a plurality of sub-pixels sequentially arranged in a horizontal direction are referred to as a pixel row, and a plurality of sub-pixels sequentially arranged in a vertical direction are referred to as a pixel column; a plurality of pixel rows and a plurality of pixel columns together constitute a pixel array arranged in an array.

Figure 3:
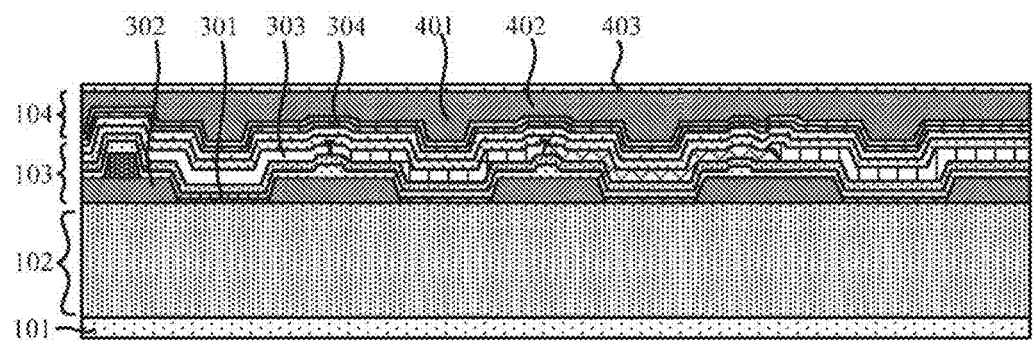
FIG. 3 is a schematic diagram of a sectional structure of a display substrate.

FIG. 3 is a schematic diagram of a sectional structure of a display substrate, and illustrates a structure of four sub-pixels of the display substrate. As shown in FIG. 3, on a plane perpendicular to the display substrate, each sub-pixel of the display substrate may include a drive circuit layer 102 arranged on a base substrate 101, a light emitting structure layer 103 arranged on a side of the drive circuit layer 102 away from the base substrate, and an encapsulation structure layer 104 arranged on a side of the light emitting structure layer 103 away from the base substrate.

In an exemplary implementation mode, the base substrate 101 may be a flexible base substrate, or a rigid base substrate. The drive circuit layer 102 of each sub-pixel may at least include a pixel drive circuit composed of a plurality of transistors and a storage capacitor. The light emitting structure layer 103 of each sub-pixel may at least include a light emitting device and a pixel definition layer 302, wherein the light emitting device may include an anode 301, an organic emitting layer 303, and a cathode 304. The anode 301 is connected with the pixel drive circuit, the organic emitting layer 303 is connected with the anode 301, the cathode 304 is connected with the organic emitting layer 303, and the organic emitting layer 303 emits light of a corresponding color under drive of the anode 301 and the cathode 304. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403, thus ensuring that external water vapor cannot enter the light emitting structure layer 103.

In an exemplary implementation mode, the organic emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL). In an exemplary implementation mode, hole injection layers, hole transport layers, electron block layers, hole block layers, electron transport layers, and electron injection layers of all sub-pixels may be a common layer connected together, and emitting layers of all sub-pixels may be a common layer connected together, or may be isolated from each other, and emitting layers of adjacent sub-pixels may be overlapped slightly. In some possible implementation modes, the display substrate may include another film layer, which is not limited here in the present disclosure.

Figure 4:
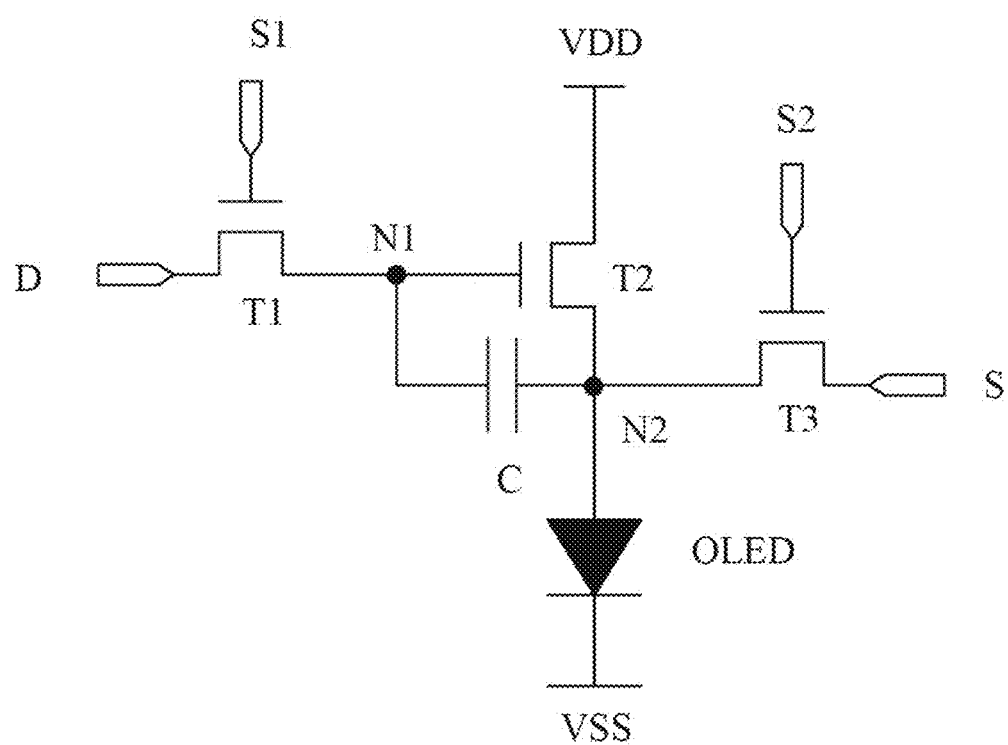
FIG. 4 is a schematic diagram of an equivalent circuit of a pixel drive circuit.

FIG. 4 is a schematic diagram of an equivalent circuit of a pixel drive circuit. In an exemplary implementation mode, the pixel drive circuit may have a structure of 3T1C, 4T1C, 5T1C, 5T2C, 6T1C, 7T1C, or 8T1C. As shown in FIG. 4, the pixel drive circuit has a 3T1C structure, which may include three transistors (a first transistor T1, a second transistor T2, and a third transistor T3), one storage capacitor C, and six signal lines (a data signal line D, a first scan signal line S1, a second scan signal line S2, a compensation signal line S, a first power supply line VDD, and a second power supply line VSS).

In an exemplary implementation mode, the first transistor T1 is a switching transistor, the second transistor T2 is a drive transistor, and the third transistor T3 is a compensation transistor. A first electrode of the storage capacitor C is coupled to a gate electrode of the second transistor T2, a second electrode of the storage capacitor C is coupled to a second electrode of the second transistor T2, and the storage capacitor C is configured to store a potential of the gate electrode of the second transistor T2. A gate electrode of the first transistor T1 is coupled to the first scan signal line S1, a first electrode of the first transistor T1 is coupled to the data signal line D, a second electrode of the first transistor T1 is coupled to the gate electrode of the second transistor T2. The first transistor T1 is configured to receive a data signal transmitted by the data signal line D under control of the first scan signal line S1, so that the gate electrode of the second transistor T2 receives the data signal. The gate electrode of the second transistor T2 is coupled to a second electrode of the first transistor T1, the first electrode of the second transistor T2 is coupled to the first power supply line VDD, the second electrode of the second transistor T2 is coupled to a first electrode of a light emitting device, and the second transistor T2 is configured to generate a corresponding current at the second electrode under control of the data signal received by the gate electrode of the second transistor. A gate electrode of the third transistor T3 is coupled to the second scan signal line S2, a first electrode of the third transistor T3 is coupled to the compensation signal line S, a second electrode of the third transistor T3 is coupled to the second electrode of the second transistor T2. The third transistor T3 is configured to extract a threshold voltage Vth and a mobility of the second transistor T2 in response to compensation timing, so as to compensate the threshold voltage Vth.

In an exemplary implementation mode, the light emitting device may be an OLED, including a first electrode (anode), an organic emitting layer, and a second electrode (cathode) that are stacked. A first electrode of the OLED is coupled to the second electrode of the second transistor T2, a second electrode of the OLED is coupled to the second power supply line VSS, and the OLED is configured to emit light with corresponding brightness in response to a current of the second electrode of the second transistor T2.

In an exemplary implementation mode, a signal of the first power supply line VDD is a high-level signal continuously provided, and a signal of the second power supply line VSS is a low-level signal continuously provided. The first transistor T1 to the third transistor T3 may be P-type transistors or may be N-type transistors. Use of a same type of transistors in a pixel drive circuit may simplify a process flow, reduce process difficulties of a display panel, and improve a product yield.

In an exemplary implementation mode, for the first transistor T1 to the third transistors T3, low temperature poly silicon thin film transistors may be adopted, or oxide thin film transistors may be adopted, or a low temperature poly silicon thin film transistor and an oxide thin film transistor may be adopted. An active layer of a low temperature poly silicon thin film transistor is made of Low Temperature Poly Silicon (LTPS for short), and an active layer of an oxide thin film transistor is made of an oxide. The low temperature poly silicon thin film transistor has advantages of a high mobility, fast charging, and the like, and the oxide thin film transistor has advantages of a low leakage current and the like. In an exemplary implementation mode, a low temperature poly silicon thin film transistor and an oxide thin film transistor may be integrated on one display substrate to form a Low Temperature Polycrystalline Oxide (LTPO for short) display substrate, so that advantages of the two may be utilized, high Pixel Per Inch (PPI for short) and low-frequency drive may be achieved, power consumption may be reduced, and display quality may be improved.

In an exemplary implementation mode, taking a case that three transistors are all N-type transistors as an example, a working process of the pixel drive circuit illustrated in FIG. 4 may include following stages.

In a first stage A1, signals of the first scan signal line S1 and the second scan signal line S2 are high-level signals, the data signal line D outputs a data voltage, the compensation signal line S outputs a compensation voltage, a signal of the first power supply line VDD is at a high level, and a signal of the second power supply line VSS is at a low level. A signal of the first scan signal line S1 is a high-level signal, so that the first transistor T1 is turned on, the data voltage output by the data signal line D is written into a first node N1, a potential of the first node N1 is pulled high, and the storage capacitor C is charged. At this time, the potential of the first node N1 is $V_1 = V_{data}$. A signal of the second scan signal line S2 is a high-level signal, so that the third transistor T3 is turned on, and the compensation voltage output by the compensation signal line S is written to a second node N2. At this time, a potential the potential of the second node N2 is $V_2 = V_s$. Since a potential difference between the first node N1 and the second node N2 is greater than a threshold voltage Vth of the second transistor T2, the second transistor T2 is turned on, a power supply voltage output from the first power supply line VDD provides a drive voltage to the first electrode of the OLED through the turned-on second transistor T2 to drive the OLED to emit light.

In a second stage A2, signals of the first scan signal line S1 and the second scan signal line S2 are low-level signals, so that the first transistor T1 and the third transistor T3 are turned off, a voltage in the storage capacitor C still keeps the second transistor T2 in a turned-on state, a power supply voltage output by the first power supply line VDD continuously pulls a potential of the second node N2 up, and the OLED continuously emits light. When the potential of the second node N2 is equal to $V_{data} - V_{th}$, the second transistor T2 is turned off and the OLED no longer emits light.

In an exemplary implementation mode, to drive the OLED to emit light normally, the OLED and the second transistor T2 are both forward biased. In the first stage, the power supply voltage output by the first power supply line VDD is greater than the data voltage output by the data signal line D, the data voltage output by the data signal line D is greater than the compensation voltage output by the compensation signal line S, and the compensation voltage output by the compensation signal line S is greater than a power supply voltage output by the second power supply line VSS.

An exemplary embodiment of the present disclosure provides a display substrate including a plurality of sub-pixels, wherein at least one sub-pixel includes a pixel drive circuit, the pixel drive circuit is connected with a scan signal line extending along a first direction and a first power supply line extending along a second direction, the scan signal line is configured to provide a scan signal to the pixel drive circuit, the first power supply line is configured to provide a high voltage signal to the pixel drive circuit, and the first direction intersects with the second direction; and in at least one sub-pixel, the scan signal line is provided with at least one fracture for cutting off the scan signal line, scan signal lines on both sides of the fracture are connected with each other through a signal connection electrode, a length of the signal connection electrode is larger than a width of the first power supply line, and the length of the signal connection electrode is smaller than a width of the sub-pixel, wherein the length is a dimension of the signal connection electrode in the first direction, the width is a dimension of the first power supply line in the first direction, and the width of the sub-pixel is a dimension of the sub-pixel in the first direction X.

In an exemplary implementation mode, the scan signal line includes a first scan signal line that provides a first scan signal to the pixel drive circuit, the fracture includes a first fracture that cuts off the first scan signal line, the signal connection electrode includes a first signal connection electrode, a first end of the first signal connection electrode is connected with the first scan signal line on one side of the first fracture through a via, a second end of the first signal connection electrode is connected with the first scan signal line on the other side of the first fracture through a via, a length of the first signal connection electrode is larger than a width of the first power supply line, and the length of the first signal connection electrode is smaller than a width of the sub-pixel.

In another exemplary implementation mode, the scan signal line includes a second scan signal line that provides a second scan signal to the pixel drive circuit, the fracture includes a second fracture that cuts off the second scan signal line, the signal connection electrode includes a second signal connection electrode, a first end of the second signal connection electrode is connected with the second scan signal line on one side of the second fracture through a via, a second end of the second signal connection electrode is connected with the second scan signal line on the other side of the second fracture through a via, a length of the second signal connection electrode is larger than a width of the first power supply line, and the length of the second signal connection electrode is smaller than a width of the sub-pixel.

In yet another exemplary implementation mode, the scan signal line includes a second scan signal line that provides a second scan signal to the pixel drive circuit, the fracture includes a second fracture that cuts off the second scan signal line, and the signal connection electrode includes a third signal connection electrode, a fourth signal connection electrode, and a fifth signal connection electrode, wherein a first end of the third signal connection electrode and the second scan signal line on one side of the second fracture are respectively connected with the fourth signal connection electrode through vias, a second end of the third signal connection electrode and the second scan signal line on the other side of the second fracture are respectively connected with the fifth signal connection electrode through vias, a length of the third signal connection electrode is larger than a width of the first power supply line, and the length of the third signal connection electrode is smaller than a width of the sub-pixel.

In yet another exemplary implementation mode, the scan signal line includes a first scan signal line that provides a first scan signal to the pixel drive circuit and a second scan signal line that provides a second scan signal to the pixel drive circuit, the fracture includes a first fracture that cuts off the first scan signal line and a second fracture that cuts off the second scan signal line, and the signal connection electrode includes a first signal connection electrode and a second signal connection electrode, wherein the first signal connection electrode is respectively connected with first signal connection electrodes on both sides of the first fracture through vias, and the second signal connection electrode is respectively connected with second signal connection electrodes on both sides of the second fracture through vias.

Figure 5:
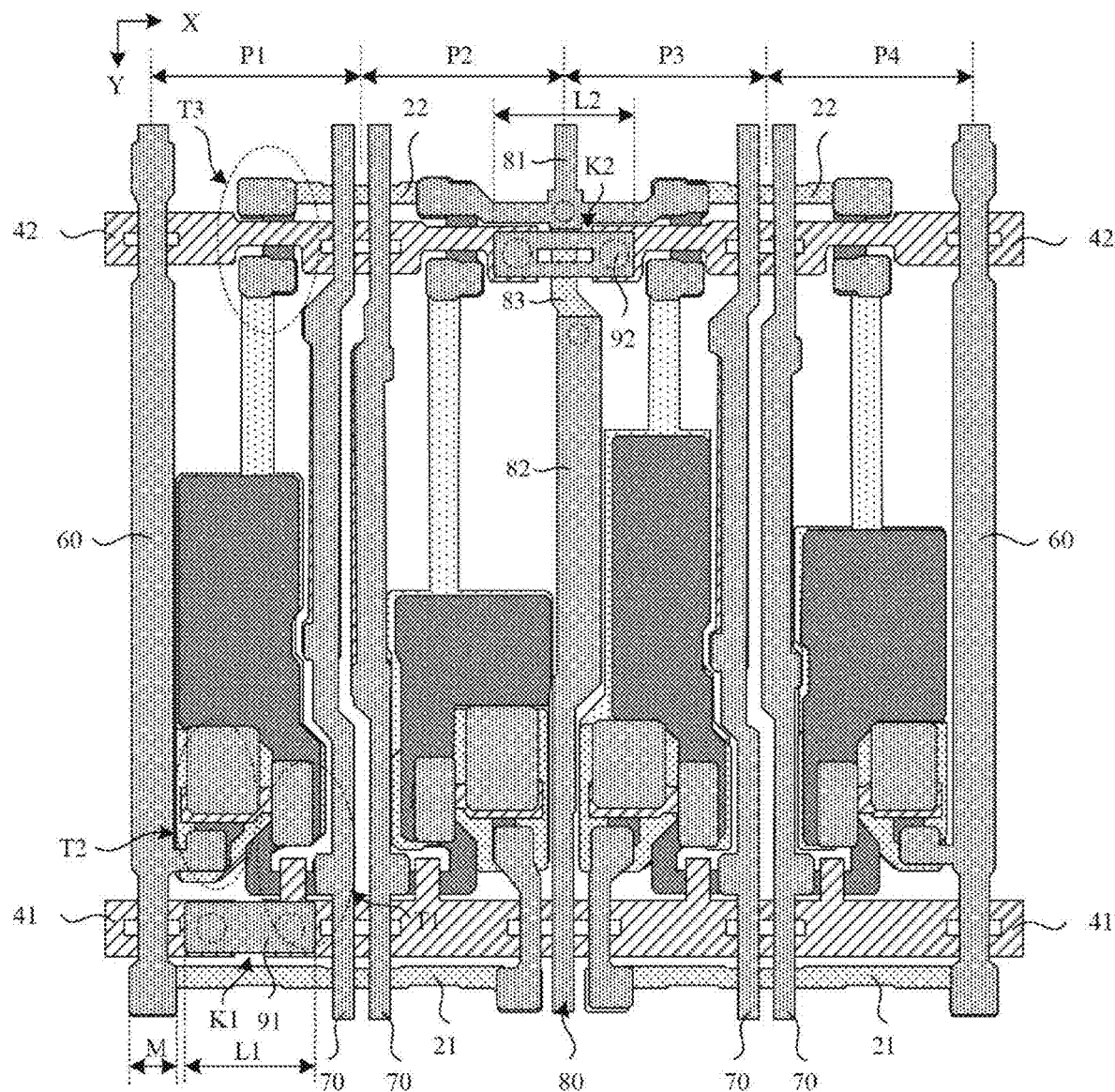
FIG. 5 is a schematic diagram of a structure of a display substrate according to an exemplary embodiment of the present disclosure.

FIG. 5 is a schematic diagram of a structure of a display substrate according to an exemplary embodiment of the present disclosure, illustrating a structure of a drive circuit layer of one pixel unit (four sub-pixels) in a bottom emission display substrate. As shown in FIG. 5, in a direction parallel to the display substrate, at least one pixel unit may include a first sub-pixel P1, a second sub-pixel P2, a third sub-pixel P3, and a fourth sub-pixel P4 arranged sequentially along a first direction X, and each sub-pixel may include a pixel drive circuit and a storage capacitor. In following description, a sub-pixel refers to a region where a pixel drive circuit is provided.

In an exemplary implementation mode, the at least one pixel unit may include one first scan signal line 41, one second scan signal line 42, two first power supply lines 60, four data signal lines 70, and one compensation signal line 80, and all the signal lines described above are connected with pixel drive circuits in the four sub-pixels.

In an exemplary implementation mode, shapes of the first scan signal line 41 and the second scan signal line 42 may be straight lines extending along a first direction X, and the first scan signal line 41 and the second scan signal line 42 are arranged sequentially along a second direction Y, wherein the first direction X intersects with the second direction Y.

In an exemplary implementation mode, shapes of a first power supply line 60, a data signal line 70, and a compensation signal line 80 may be straight lines extending along the second direction Y.

In an exemplary implementation mode, two first power supply lines 60 may be respectively arranged on both sides of the pixel unit in the first direction X, four data signal lines 70 and one compensation signal line 80 may be arranged between the two first power supply lines 60, two of the four data signal lines 70 may be located between the compensation signal line 80 and one first power supply line 60, and the other two of the four data signal lines 70 may be located between the compensation signal line 80 and the other first power supply line 60. Thus, four sub-pixels may be formed between two first power supply lines 60 by providing four data signal lines 70 and one compensation signal line 80, and correspondingly, four sub-pixels may also be formed between two compensation signal lines 80 by providing two first power supply lines 60 and four data signal lines 70.

In an exemplary implementation mode, a first sub-pixel P1 is formed between a first power supply line 60 and a data signal line 70 adjacent to the first direction X, a second sub-pixel P2 is formed between the compensation signal line 80 and a data signal line 70 adjacent to an opposite direction of the first direction X, a third sub-pixel P3 is formed between the compensation signal line 80 and a data signal line 70 adjacent to the first direction X, and a fourth sub-pixel P4 is formed between the other first power supply line 60 and a data signal line 70 adjacent to the opposite direction of the first direction X.

In an exemplary implementation mode, among the four sub-pixels of the pixel unit, a pixel drive circuit of at least one sub-pixel may include a first transistor T1, a second transistor T2, a third transistor T3, and a storage capacitor. The first transistor T1, the second transistor T2, and the third transistor T3 may each include an active layer, a gate electrode, a first electrode, and a second electrode, and the storage capacitor may include a transparent first electrode plate and a transparent second electrode plate, which form a transparent storage capacitor.

In an exemplary implementation mode, the first scan signal line 41 is connected with a gate electrode of a first transistor T1 in each sub-pixel, the second scan signal line 42 is connected with a gate electrode of a third transistor T3 in each sub-pixel, the data signal line 70 is connected with a first electrode of the first transistor T1 in each sub-pixel, the compensation signal line 80 is connected with a first electrode of the third transistor T3 in each sub-pixel, the first power supply line 60 is connected with a first electrode of a second transistor T2 in each sub-pixel, the second electrode of the first transistor T1 in each sub-pixel is connected with a gate electrode of the second transistor T2, the second electrode of the second transistor T2 in each sub-pixel is connected with the first electrode of the third transistor T3 and an anode of a light emitting device, a first electrode plate in each sub-pixel is connected with the second electrode of the second transistor T2 and a second electrode of the third transistor T3, respectively, and a second electrode plate in each sub-pixel is connected with the second electrode of the first transistor T1 and the gate electrode of the second transistor T2, respectively.

In an exemplary implementation mode, at least one pixel unit may further include a plurality of connection lines, wherein the plurality of connection lines may at least include two power supply connection lines 21 extending along the first direction X and two compensation connection lines 22 extending along the first direction X, thereby forming a one-drag-two structure of a first power supply line and a one-drag-four structure of a compensation signal line.

In an exemplary implementation mode, a power supply connection line 21 is provided at the first sub-pixel P1 and the second sub-pixel P2, a first end of the power supply connection line 21 is connected with a first power supply line 60 located in the first sub-pixel P1 through a via, and a second end of the power supply connection line 21 is connected with a second transistor T2 in the second sub-pixel P2 through a via. Another power supply connection line 21 is provided at the third sub-pixel P3 and the fourth sub-pixel P4, a first end of the power supply connection line 21 is connected with the first power supply line 60 located in the fourth sub-pixel P4 through a via, and a second end of the power supply connection line 21 is connected with a second transistor T2 in the third sub-pixel P3 through a via. Thus, one first power supply line 60 can provide a power supply signal to pixel drive circuits of two sub-pixels through one power supply connection line 21.

In an exemplary implementation mode, one compensation connection line 22 is provided at the first sub-pixel P1 and the second sub-pixel P2. On one hand, the compensation connection line 22 is connected with a compensation signal line 80 through a via, and on the other hand, the compensation connection line 22 is respectively connected with third transistors T3 in the first sub-pixel P1 and the second sub-pixel P2 through vias. Another compensation connection line 22 is provided at the third sub-pixel P3 and the fourth sub-pixel P4, on one hand, the compensation connection line 22 is connected with the compensation signal line 80 through a via, and on the other hand, the compensation connection line 22 is respectively connected with third transistors T3 in the third sub-pixel P3 and the fourth sub-pixel P4 through vias. Thus, one compensation signal line 80 can provide a compensation signal to pixel drive circuits of four sub-pixels.

According to the embodiment of the present disclosure, through the one-drag-two structure of the first power supply line and the one-drag-four structure of the compensation signal line, a quantity of signal lines is saved, occupied space is reduced, a structure is simple, a layout is reasonable, layout space is fully utilized, a space utilization rate is improved, which is beneficial to improving a resolution.

In an exemplary implementation mode, at least one of the first scan signal line 41 and the second scan signal line 42 is provided with at least one fracture that cuts off a scan signal line, and scan signal lines on both sides of the fracture are connected with each other through a signal connection electrode.

In an exemplary implementation mode, a first scan signal line 41 in at least one sub-pixel is provided with a first fracture K1 that cuts off the first scan signal line 41, and first scan signal lines 41 on both sides of the first fracture K1 are connected through a first signal connection electrode 91. In an exemplary implementation mode, a first end of the first signal connection electrode 91 is connected with a first scan signal line 41 on a side of the first fracture K1 in an opposite direction of the first direction X through a via, and a second end of the first signal connection electrode 91 is connected with a first scan signal line 41 on a side of the first fracture K1 in the first direction X through a via, thereby achieving continuous transmission of a first scan signal.

In an exemplary implementation mode, the first signal connection electrode 92 has a first length L1, and the first power supply line 60 has a width M. The first length L1 may be a dimension of the first signal connection electrode 91 in the first direction X, i.e., a dimension in an extending direction of the first signal connection electrode 91. The width M may be a dimension of the first power supply line 60 in the second direction Y, i.e., a dimension perpendicular to an extending direction of the first power supply line 60. In an exemplary implementation mode, the width M may be a maximum dimension of the first power supply line 60 in the second direction Y, or the width M may be an average dimension of the first power supply line 60 in the second direction Y.

In an exemplary implementation mode, the first length L1 of the first signal connection electrode 91 may be greater than the width M of the first power supply line 60.

In an exemplary implementation mode, at least one sub-pixel has a width of the sub-pixel, the width of the sub-pixel may be a dimension of the sub-pixel in the first direction X, and the first length L1 of the first signal connection electrode 91 may be less than the width of the sub-pixel.

In an exemplary implementation mode, the first length L1 of the first signal connection electrode 91 may be about 50% to 80% of the width of the sub-pixel.

In an exemplary implementation mode, an orthographic projection of the first connection electrode 91 on the display substrate is not overlapped with orthographic projections of the first power supply line 60 and the data signal line 70 on the display substrate.

In an exemplary implementation mode, the first fracture K1 and the first signal connection electrode 91 may be arranged within the first sub-pixel P1, or the first fracture K1 and the first signal connection electrode 91 may be arranged within the second sub-pixel P2, or the first fracture K1 and the first signal connection electrode 91 may be arranged within the third sub-pixel P3, or the first fracture K1 and the first signal connection electrode 91 may be arranged within the fourth sub-pixel P4.

In another exemplary implementation mode, a second scan signal line 42 in at least one sub-pixel is provided with a second fracture K2 that cuts off the second scan signal line 42, and second scan signal lines 42 on both sides of the second fracture K2 are connected through a second signal connection electrode 92. In an exemplary implementation mode, a first end of the second signal connection electrode 92 is connected with a second scan signal line 42 on a side of the second fracture K2 in an opposite direction of the first direction X through a via, and a second end of the second signal connection electrode 92 is connected with a second scan signal line 42 on a side of the second fracture K2 in the first direction X through a via, thereby achieving continuous transmission of a second scan signal.

In an exemplary implementation mode, the second signal connection electrode 92 has a second length L2, and the first power supply line 60 has a width M, wherein the second length L2 may be a dimension of the second signal connection electrode 92 in the first direction X, i.e., a dimension in an extending direction of the second signal connection electrode 92.

In an exemplary implementation mode, the second length L2 of the second signal connection electrode 92 may be greater than the width M of the first power supply line 60.

In an exemplary implementation mode, the second length L2 of the second signal connection electrode 92 may be less than a width of the sub-pixel.

In an exemplary implementation mode, the second length L2 of the second signal connection electrode 92 may be about 50% to 80% of the width of the sub-pixel.

In an exemplary implementation mode, an orthographic projection of the second connection electrode 92 on the display substrate is not overlapped with orthographic projections of the first power supply line 60 and the data signal line 70 on the display substrate.

In an exemplary implementation mode, the second fracture K2 and the second signal connection electrode 92 may be arranged in a region between the second sub-pixel P2 and the third sub-pixel P3.

In an exemplary implementation mode, a compensation signal lines 80 in at least one sub-pixel may at least include a first compensation signal line 81 and a second compensation signal line 82 which are arranged at intervals, and a compensation connection electrode 83 connecting the first compensation signal line 81 and the second compensation signal line 82. A first end of the compensation connection electrode 83 is connected with the first compensation signal line 81 through a via, and a second end of the compensation connection electrode 83 is connected with the second compensation signal line 82 through a via, thereby achieving continuous transmission of a compensation signal.

In an exemplary implementation mode, the first compensation signal line 81, the second compensation signal line 82, and the compensation connection electrode 83 may be arranged between the second sub-pixel P2 and the third sub-pixel P3.

In an exemplary implementation mode, an orthographic projection of the compensation connection electrode 83 on the display substrate is at least partially overlapped with an orthographic projection of the second fracture K2 on the display substrate.

In an exemplary implementation mode, an orthographic projection of the compensation connection electrode 83 on the display substrate is at least partially overlapped with an orthographic projection of the second signal connection electrode 92 on the display substrate.

In an exemplary implementation mode, at least one through hole is provided on the second signal connection electrode, and an orthographic projection of the through hole on the display substrate is at least partially overlapped with an orthographic projection of the compensation connection electrode 83 on the display substrate.

In yet another exemplary implementation mode, a first scan signal line 41 in at least one sub-pixel is provided with a first fracture K1 that cuts off the first scan signal line 41, a second scan signal line 42 in the at least one sub-pixel is provided with a second fracture K2 that cuts off the second scan signal line 42, first scan signal lines 41 on both sides of the first fracture K1 are connected through a first signal connection electrode 91, and second scan signal lines 42 on both sides of the second fracture K2 are connected through a second signal connection electrode 92.

In an exemplary implementation mode, the first fracture K1 and the first signal connection electrode 91 may be arranged at any one or more of following positions: a first sub-pixel P1, a second sub-pixel P2, a third sub-pixel P3, a fourth sub-pixel P4, and a region between the second sub-pixel P2 and the third sub-pixel P3. The second fracture K2 and the second signal connection electrode 92 may be arranged at any one or more of following positions: a first sub-pixel P1, a second sub-pixel P2, a third sub-pixel P3, a fourth sub-pixel P4, and a region between the second sub-pixel P2 and the third sub-pixel P3. For example, the first fracture K1 and the first signal connection electrode 91 may be arranged within at least one sub-pixel of the first sub-pixel P1 to the fourth sub-pixel P4, and the second fracture K2 and the second signal connection electrode 92 may be arranged within at least one sub-pixel of the first sub-pixel P1 to the fourth sub-pixel P4. For another example, the first fracture K1 and the first signal connection electrode 91 may be arranged within at least one sub-pixel of the first sub-pixel P1 to the fourth sub-pixel P4, and the second fracture K2 and the second signal connection electrode 92 may be arranged in a region between the second sub-pixel P2 and the third sub-pixel P3. For yet another example, the first fracture K1 and the first signal connection electrode 91 may be arranged in a region between the second sub-pixel P2 and the third sub-pixel P3, and the second fracture K2 and the second signal connection electrode 92 may be arranged within at least one sub-pixel of the first sub-pixel P1 to the fourth sub-pixel P4. For yet another example, the first fracture K1 and the first signal connection electrode 91 may be arranged in a region between the second sub-pixel P2 and the third sub-pixel P3, and the second fracture K2 and the second signal connection electrode 92 may be arranged in a region between the second sub-pixel P2 and the third sub-pixel P3.

In an exemplary implementation mode, in a direction perpendicular to a display substrate, the display substrate may include a transparent conductive layer, a first conductive layer, a first insulation layer, a semiconductor layer, a second insulation layer, a second conductive layer, a third insulation layer, and a third conductive layer that are stacked on a base substrate.

In an exemplary implementation mode, the transparent conductive layer may at least include a first electrode plate of a storage capacitor, and the semiconductor layer may at least include a second electrode plate of the storage capacitor, wherein an orthographic projection of the first electrode plate on the base substrate is at least partially overlapped with an orthographic projection of the second electrode plate on the base substrate to form a transparent storage capacitor. The second conductive layer may at least include a first scan signal line 41 and a second scan signal line 42, and the third conductive layer may at least include a first power supply line 60, a first signal connection electrode 91, and a second signal connection electrode 92, that is, the first signal connection electrode 91 and the second signal connection electrode 92 may be arranged in a same layer as the first power supply line 60, and the first scan signal line 41 and the second scan signal line 42 may be arranged in different layers from the first power supply line 60.

In an exemplary implementation mode, the first conductive layer may further include a compensation connection electrode 83, and the third conductive layer may further include a first compensation signal line 81 and a second compensation signal line 82.

In an exemplary implementation mode, the transparent conductive layer may at least include a first electrode plate of a storage capacitor, the first conductive layer may at least include a power supply connection line 21, a compensation connection line 22, a shield layer 23, and a compensation connection electrode 83, the semiconductor layer may at least include a second electrode plate of the storage capacitor and active layers of three transistors, the second conductive layer may at least include a first scan signal line 41, a second scan signal line 42, and gate electrodes of the three transistors, and the third conductive layer may at least include a first power supply line 60, a data signal line 70, a compensation signal line 80, first electrodes and second electrodes of the three transistors, a first signal connection electrode 91, and a second signal connection electrode 92.

In an exemplary implementation mode, an orthographic projection of an active layer of a second transistor on the base substrate is located within a range of an orthographic projection of the shield layer on the base substrate.

In an exemplary implementation mode, a plurality of through holes may be provided on the first scan signal line 41 and the second scan signal line 42, and orthographic projections of the through holes on the base substrate are at least partially overlapped with orthographic projections of the first power supply line 60, the data signal line 70, and the compensation signal line 80 on the base substrate.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B being arranged in a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or a boundary of the orthographic projection of A is overlapped with a boundary of the orthographic projection of B.

In an exemplary implementation mode, taking four sub-pixels (a first sub-pixel P1, a second sub-pixel P2, a third sub-pixel P3, and a fourth sub-pixel P4) as an example, the preparation process of the display substrate may include following operations.

Figure 6:
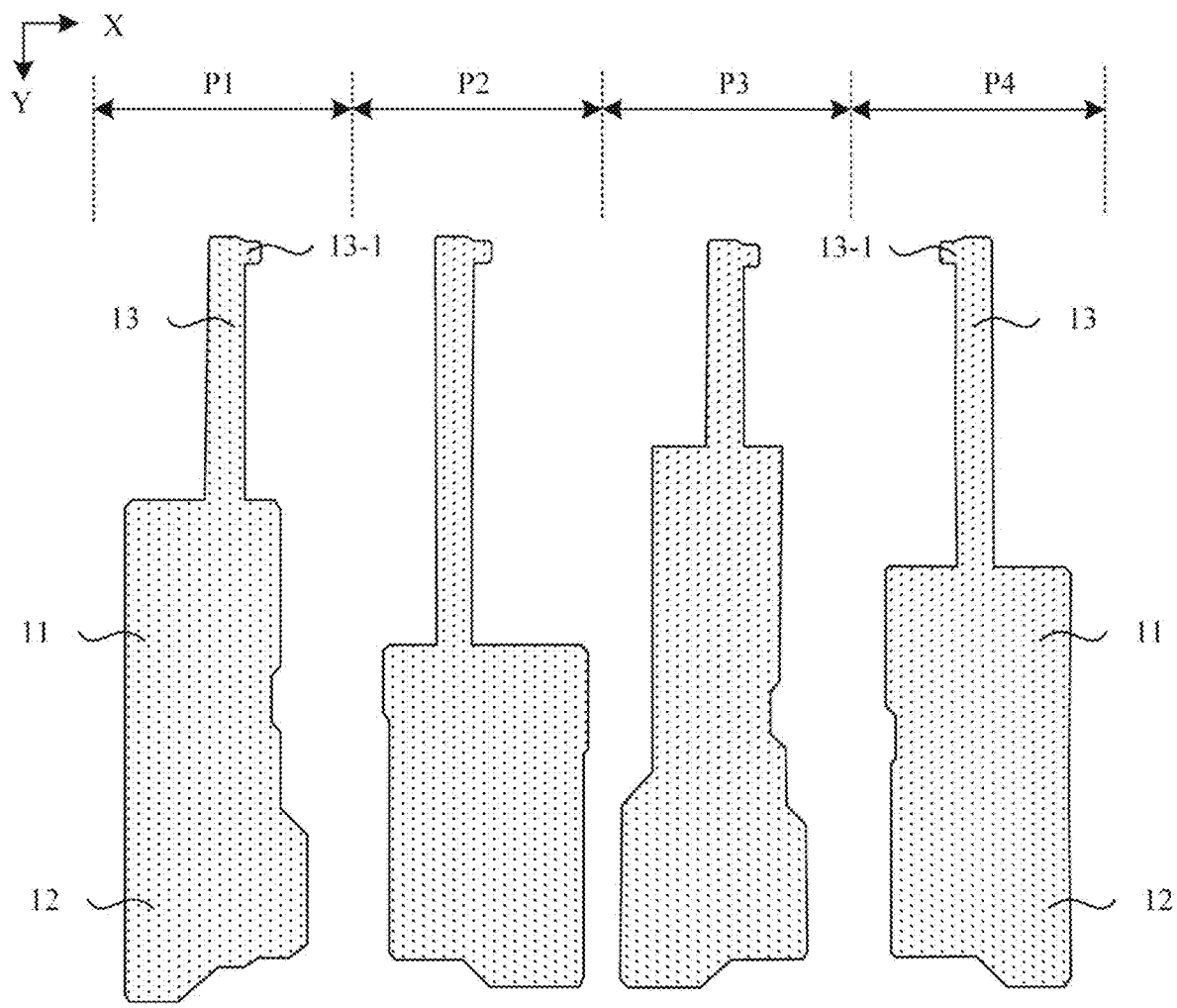
FIG. 6 is a schematic diagram after a pattern of a transparent conductive layer is formed according to an embodiment of the present disclosure.

(11) A pattern of a transparent conductive layer is formed. In an exemplary implementation mode, forming the pattern of the transparent conductive layer may include: depositing a transparent conductive thin film on a base substrate, patterning the transparent conductive thin film through a patterning process, and forming the pattern of the transparent conductive layer on the base substrate, as shown in FIG. 6. In an exemplary embodiment, the transparent conductive layer may be referred to as an Indium Tin Oxide (ITO) layer.

In an exemplary implementation mode, a pattern of a transparent conductive layer of each sub-pixel may at least include a first electrode plate 11, a connection plate 12, and a connection line 13 of a storage capacitor.

In an exemplary implementation mode, a shape of the first electrode plate 11 may be a rectangular shape, corners of the rectangular shape may be provided with chamfers, an edge of the rectangular shape may be a fold line, the first electrode plate 11 may be arranged in a middle region of the sub-pixel in a second direction Y, and the first electrode plate 11 is configured to form one transparent electrode plate of a transparent storage capacitor.

In an exemplary implementation mode, a shape of the connection plate 12 may be a polygonal shape, the connection plate 12 may be arranged on a side of the first electrode plate 11 in the second direction Y and is connected with the first electrode plate 11, and the connection plate 12 is configured to be connected with a shield layer formed subsequently.

In an exemplary implementation mode, a shape of the connection line 13 may be a strip shape extending along the second direction Y, and the connection line 13 may be arranged on a side of the first electrode plate 11 away from the connection plate 12 and is connected with the first electrode plate 11. An end of the connection line 13 away from the first electrode plate 11 may be provided with a connection block 13-1, a shape of the connection block 13-1 may be a strip shape extending along a first direction X and is connected with the connection line 13, and the connection block 13-1 is configured to be connected with an interlayer connection electrode formed subsequently.

In an exemplary implementation mode, the first electrode plate 11, the connection plate 12, and the connection line 13 may be of an integral structure connected with each other.

Figure 7A:
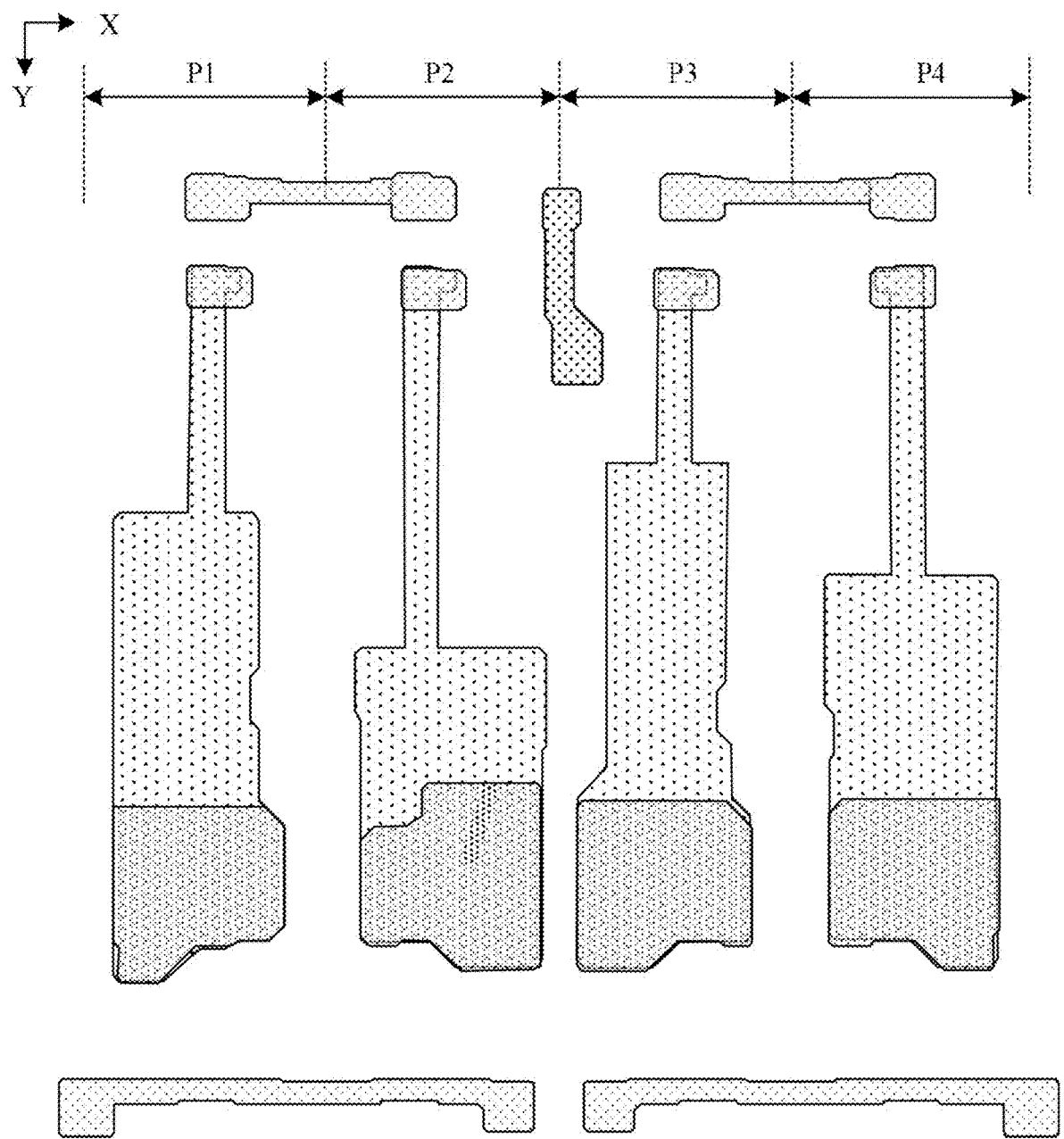
FIG. 7*a* and FIG. 7*b* are schematic diagrams after a pattern of a first conductive layer is formed according to an embodiment of the present disclosure.
Figure 7B:
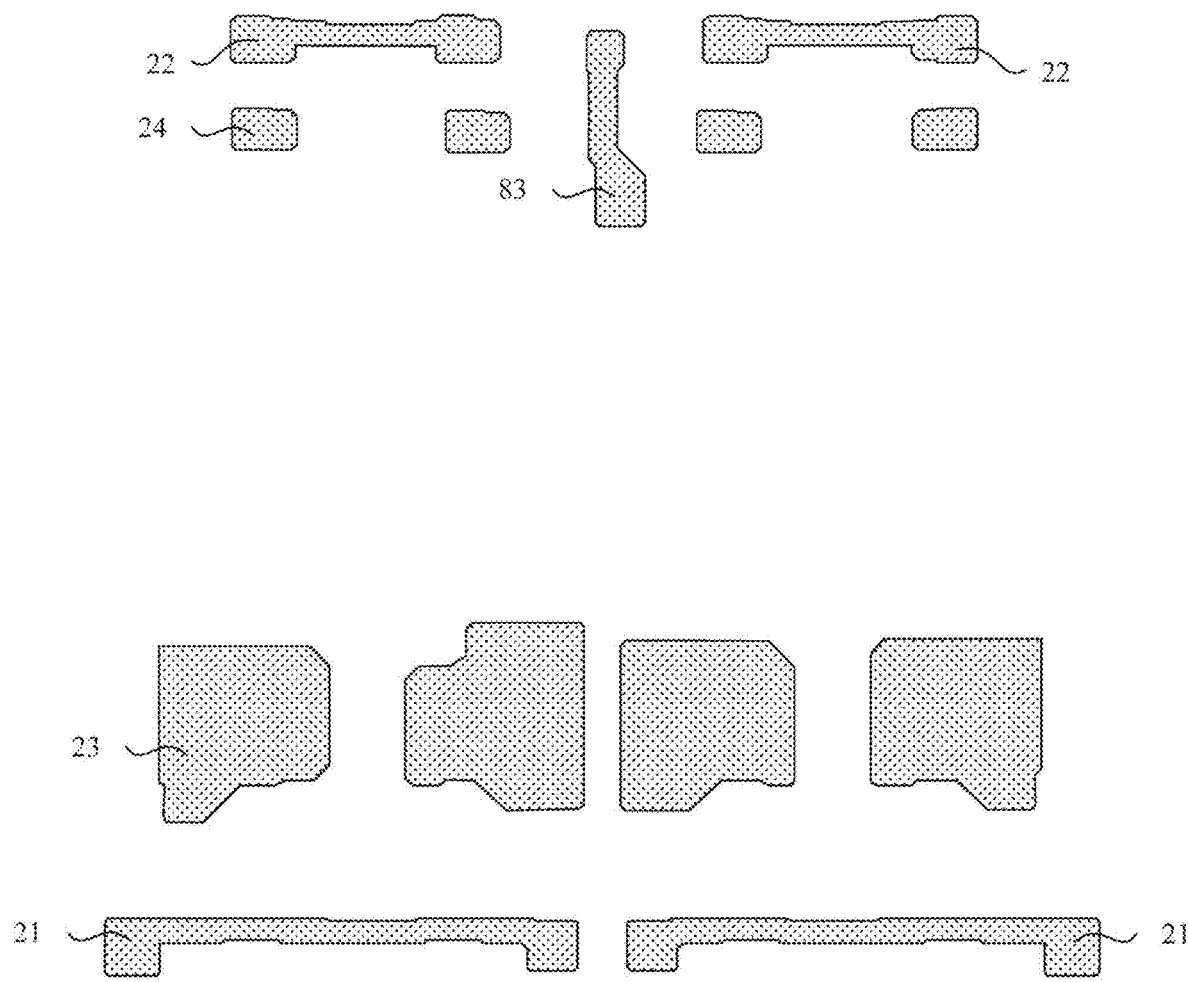

(12) A pattern of a first conductive layer is formed. In an exemplary implementation mode, forming the pattern of the first conductive layer may include: depositing a second conductive thin film on the base substrate on which the aforementioned pattern is formed, and patterning the first conductive thin film through a patterning process to form the pattern of the first conductive layer on the transparent conductive layer, as shown in FIG. 7a and FIG. 7b, and FIG. 7b is a planar schematic diagram of the first conductive layer in FIG. 7a. In an exemplary embodiment, the first conductive layer may be referred to as a Shield metal (SHL) layer.

In an exemplary implementation mode, a pattern of a first conductive layer in each sub-pixel may at least include a power supply connection line 21, a compensation connection line 22, a shield layer 23, and an interlayer connection electrode 24.

In the exemplary implementation mode, a shape of the power supply connection line 21 may be a strip shape extending along the first direction X, and the power supply connection line 21 is multiplexed as a power supply lateral connection line of a pixel unit and provides a power supply voltage to a second transistor T2 of the sub-pixel where the power supply connection line 21 is located by being connected with a first power supply line formed subsequently.

In an exemplary implementation mode, power supply connection lines 21 of adjacent sub-pixels in the first direction X may be of an integral structure connected with each other. For example, power supply connection lines 21 in the first sub-pixel P1 and the second sub-pixel P2 are connected with each other, and power supply connection lines 21 in the third sub-pixel P3 and the fourth sub-pixel P4 are connected with each other, but power supply connection lines 21 in the second sub-pixel P2 and the third sub-pixel P3 are not connected.

In an exemplary implementation mode, a shape of the compensation connection line 22 may be a strip shape extending along the first direction X, and the compensation connection line 22 is multiplexed as a compensation lateral connection line of a pixel unit and provides a compensation voltage to a third transistor T3 of the sub-pixel where the compensation connection line 22 is located by being connected with a compensation signal line formed subsequently.

In an exemplary implementation mode, compensation connection lines 22 of adjacent sub-pixels in the first direction X may be of an integral structure connected with each other. For example, compensation connection lines 22 in the first sub-pixel P1 and the second sub-pixel P2 are connected with each other, and compensation connection lines 22 in the third sub-pixel P3 and the fourth sub-pixel P4 are connected with each other, but compensation connection lines 22 in the second sub-pixel P2 and the third sub-pixel P3 are not connected.

In an exemplary implementation mode, a shape of the shield layer 23 may be a rectangular shape and the shield layer 23 may be arranged between the power supply connection line 21 and the compensation connection line 22, and the shield layer 23 is configured to provide shielding for the second transistor T2 to avoid an influence of light on a channel and reduce a leakage current, thereby avoiding an influence of illumination on characteristics of a transistor and ensuring electrical performance of the second transistor T2.

In an exemplary implementation mode, an orthographic projection of the shield layer 23 on the base substrate may be within a range of an orthographic projection of the connection plate 12 on the base substrate, and the shield layer 23 is directly lapped with the connection plate 12.

In an exemplary implementation mode, a shape of the interlayer connection electrode 24 may be a rectangular shape and the interlayer connection electrode 24 may be arranged between the shield layer 23 and the compensation connection line 22, and the interlayer connection electrode 24 is configured to be connected with a second electrode of a third transistor T3 formed subsequently.

In an exemplary implementation mode, an orthographic projection of the interlayer connection electrode 24 on the base substrate is at least partially overlapped with an orthographic projection of the connection block 13-1 of the connection line 13 on the base substrate, and the interlayer connection electrode 24 is directly lapped with the connection block 13-1.

In an exemplary implementation mode, a pattern of a transparent conductive layer of each pixel unit may also include a compensation connection electrode 83. A shape of the compensation connection electrode 83 may be a strip shape extending along the second direction Y, the compensation connection electrodes 83 may be arranged between adjacent compensation connection lines 22 in the first direction X, i.e., the compensation connection electrode 83 may be arranged between the second sub-pixel P2 and the third sub-pixel P3, and the compensation connection electrode 83 is configured as a connection electrode of a compensation signal line to connect a first compensation signal line and a second compensation signal line which are arranged at intervals by being connected with a compensation signal line formed subsequently.

Figure 8A:
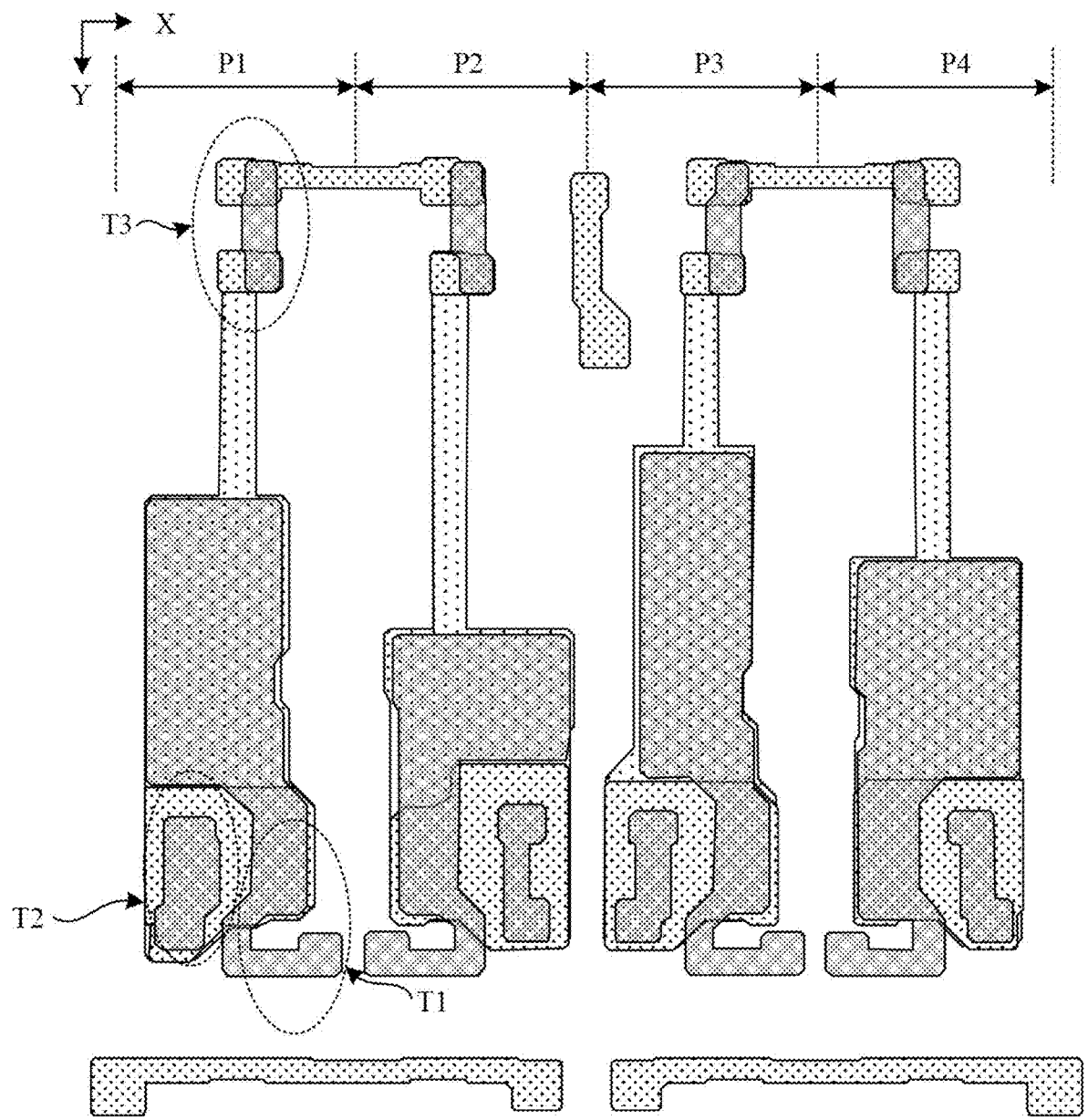
FIG. 8*a* and FIG. 8*b* are schematic diagrams after a pattern of a semiconductor layer is formed according to an embodiment of the present disclosure.
Figure 8B:
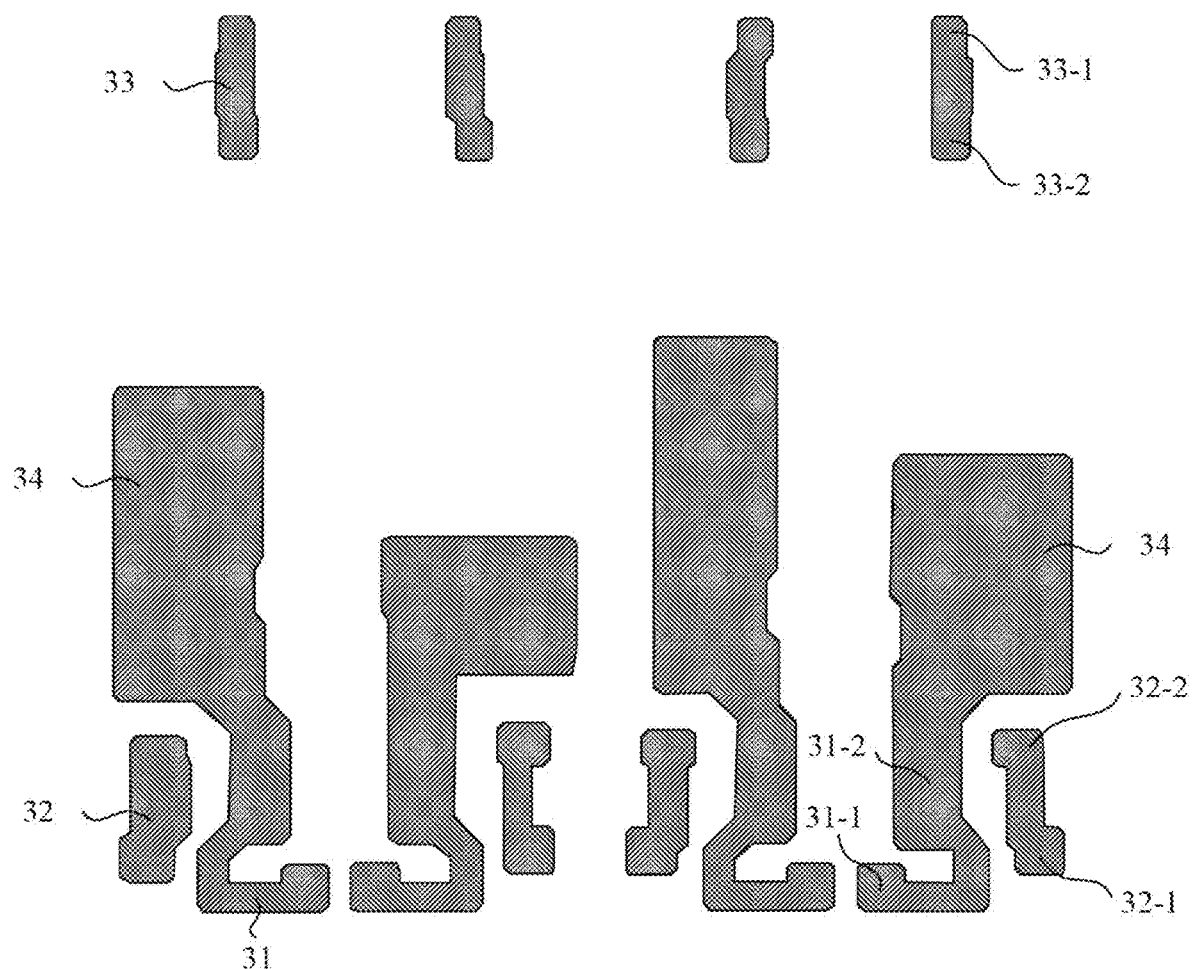

(13) A pattern of a semiconductor layer is formed. In an exemplary implementation mode, forming the pattern of the semiconductor layer may include: depositing sequentially a first insulation thin film and a semiconductor thin film on the base substrate where the aforementioned patterns are formed, and patterning the semiconductor thin film through a patterning process to form a first insulation layer covering the first conductive layer and the pattern of the semiconductor layer arranged on the first insulation layer, as shown in FIG. 8a and FIG. 8b, and FIG. 8b is a planar schematic diagram of the semiconductor layer in FIG. 8a.

In an exemplary implementation mode, a pattern of a semiconductor layer in each sub-pixel may at least include a first active layer 31, a second active layer 32, a third active layer 33, and a second electrode plate 34.

In an exemplary implementation mode, a shape of the second electrode plate 34 may be a rectangular shape, an orthographic projection of the second electrode plate 34 on the base substrate is at least partially overlapped with an orthographic projection of the first electrode plate 11 on the base substrate, the second electrode plate 34 is configured to form the other transparent electrode plate of the transparent storage capacitor, and the first electrode plate 11 and the second electrode plate 34 constitute the transparent storage capacitor.

In an exemplary implementation mode, the first active layer 31 may serve as an active layer of a first transistor T1, the second active layer 32 may serve as an active layer of a second transistor T2, the third active layer 33 may serve as an active layer of a third transistor T3, the first active layer 31 and the second active layer 32 may be arranged between the power supply connection line 21 and the second electrode plate 34, and the third active layer 33 may be arranged between the compensation connection line 22 and the second electrode plate 34.

In an exemplary implementation mode, the first active layer 31, the second active layer 32, and the third active layer 33 may each include a channel region, and a first region and a second region located on both sides of the channel region.

In an exemplary implementation mode, a shape of the first active layer 31 may be an "L" shape, a first region 31-1 of the first active layer 31 may be located on a side of a channel region away from the second electrode plate 34, a second region 31-2 of the first active layer 31 may be located on a side of the channel region close to the second electrode plate 34, and an orthographic projection of the second region 31-2 of the first active layer 31 on the base substrate is at least partially overlapped with an orthographic projection of the shield layer 23 on the base substrate.

In an exemplary implementation mode, the second region 31-2 of the first active layer 31 may be connected with the second electrode plate 34, and the first active layer 31 and the second electrode plate 34 may be of an integral structure connected with each other.

In an exemplary implementation mode, a shape of the second active layer 32 may be an "I" shape, and an orthographic projection of the second active layer 32 on the base substrate is at least partially overlapped with an orthographic projection of the shield layer 23 on the base substrate. An orthographic projection of a channel region of the second active layer 32 on the base substrate may be located within a range of the orthographic projection of the shield layer 23 on the base substrate, and the shield layer 23 may shield the channel region of the second active layer 32 to avoid an influence of light on a channel and reduce a leakage current, thereby avoiding an influence of illumination on characteristics of a transistor. A first region 32-1 of the second active layer 32 may be located on a side of the channel region away from the second electrode plate 34, and an orthographic projection of a first region 32-1 of the second active layer 32 on the base substrate may be located within the range of the orthographic projection of the shield layer 23 on the base substrate. A second region 32-2 of the second active layer 32 may be located on a side of the channel region close to the second electrode plate 34, and an orthographic projection of the second region 32-2 of the second active layer 32 on the base substrate may be located within the range of the orthographic projection of the shield layer 23 on the base substrate.

In an exemplary implementation mode, a shape of the third active layer 33 may be an "I" shape and an orthographic projection of the third active layer 33 on the base substrate and an orthographic projection of the second electrode plate 34 on the base substrate are arranged at intervals, that is, there is no overlapping region between the third active layer 33 and the second electrode plate 34, which is beneficial to design a width-to-length ratio of a channel of a third transistor according to relevant requirements. A first region 33-1 of the third active layer 33 may be located on a side of a channel region away from the second electrode plate 34, and an orthographic projection of the first region 33-1 of the third active layer 33 on the base substrate is at least partially overlapped with an orthographic projection of the compensation connection line 22 on the base substrate. A second region 33-2 of the third active layer 33 may be located on a side of the channel region close the second electrode plate 34, and an orthographic projection of the second region 33-2 of the third active layer 33 on the base substrate is at least partially overlapped with an orthographic projection of the interlayer connection electrode 24 on the base substrate.

In an exemplary implementation mode, the semiconductor layer may be made of a metal oxide such as an oxide containing indium and tin, an oxide containing tungsten and indium, an oxide containing tungsten, indium, and zinc, an oxide containing titanium and indium, an oxide containing titanium, indium, and tin, an oxide containing indium and zinc, an oxide containing silicon, indium, and tin, and an oxide containing indium, gallium, and zinc. The semiconductor layer may be a single layer, or may be a double-layer, or may be a multi-layer.

Figure 9A:
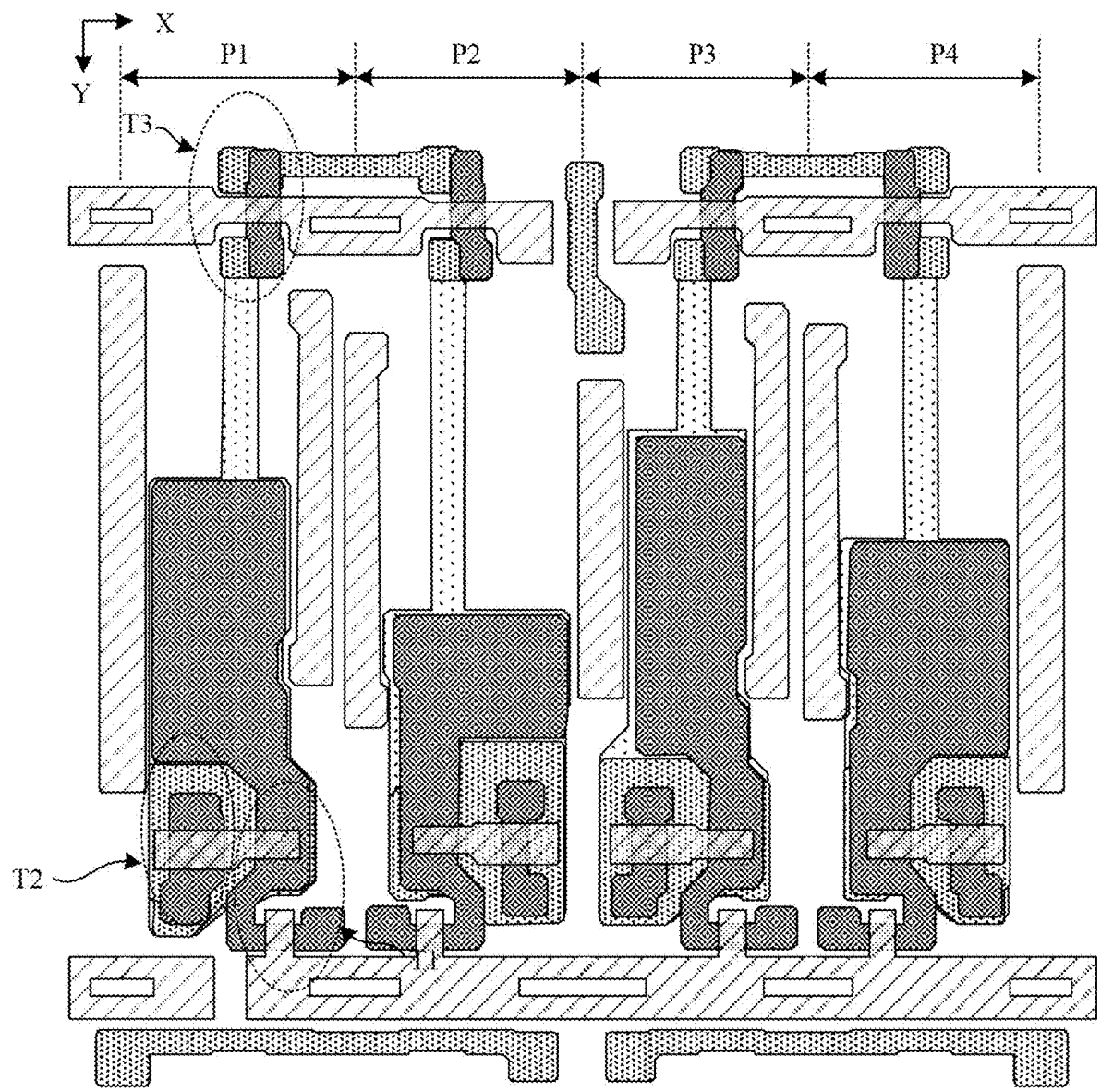
FIG. 9*a* and FIG. 9*b* are schematic diagrams after a pattern of a second conductive layer is formed according to an embodiment of the present disclosure.
Figure 9B:
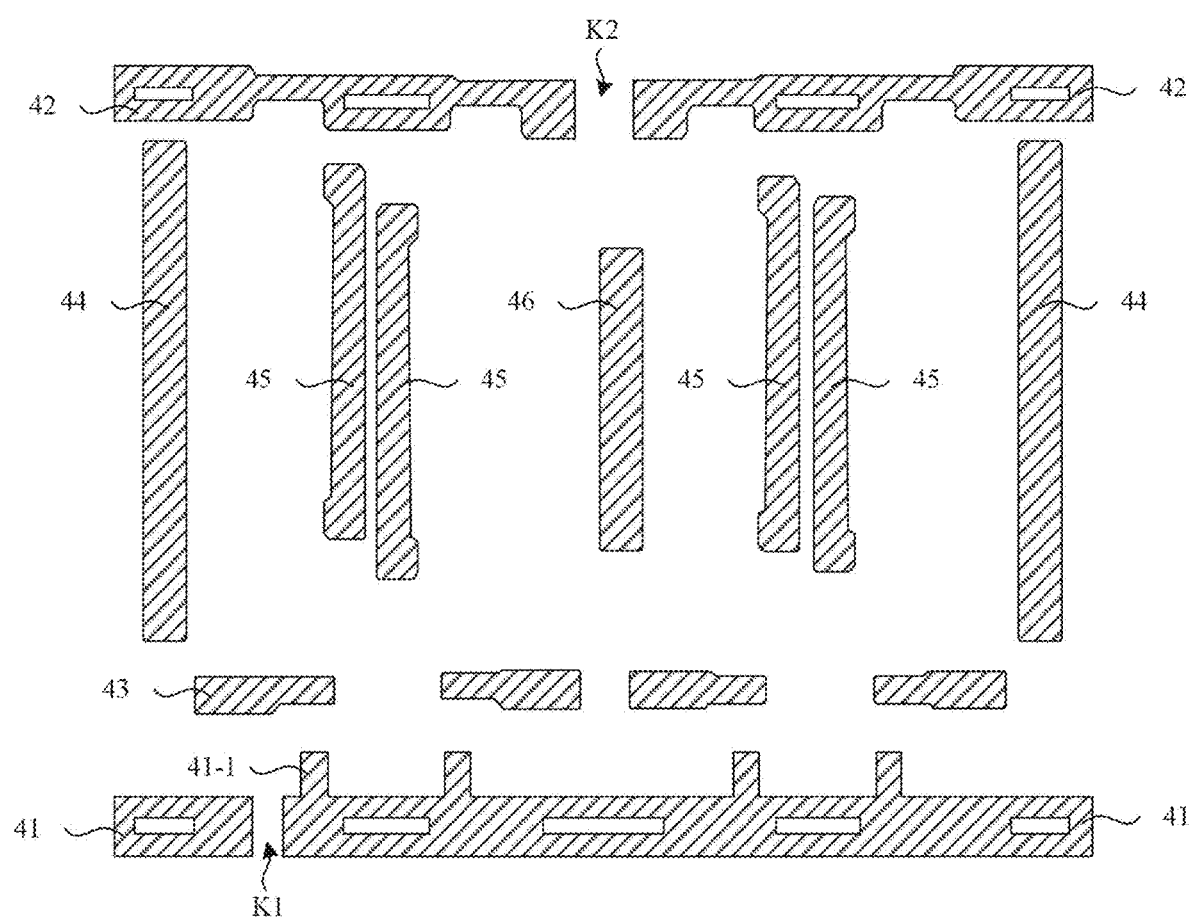

(14) A pattern of a second conductive layer is formed. In an exemplary implementation mode, forming the pattern of the second conductive layer may include: sequentially depositing a second insulation thin film and a second conductive thin film on the base substrate on which the above-mentioned patterns are formed, and patterning the second conductive thin film through a patterning process to form a second insulation layer that covers the semiconductor layer and the pattern of the second conductive layer arranged on the second insulation layer, as shown in FIG. 9a and FIG. 9b, and FIG. 9b is a planar schematic diagram of the second conductive layer in FIG. 9a. In an exemplary embodiment, the second conductive layer may be referred to as a Gate metal (GATE) layer.

In an exemplary implementation mode, a pattern of a second conductive layer in each pixel unit may at least include a first scan signal line 41, a second scan signal line 42, a second gate electrode 43, an auxiliary power supply line 44, an auxiliary data line 45, and an auxiliary compensation line 46.

In an exemplary implementation mode, a shape of the first scan signal line 41 may be a strip shape extending along the first direction X, the first scan signal line 41 may be located on a side of the second electrode plate 34 in the second direction Y, a first gate electrode 41-1 is provided on a first scan signal line 41 of each sub-pixel, the first gate electrode 41-1 serves as a gate electrode of a first transistor T1, and an orthographic projection of the first gate electrode 41-1 on the base substrate is at least partially overlapped with an orthographic projection of the first active layer 31 on the base substrate.

In an exemplary implementation mode, the first scan signal line 41 may be arranged with an equal width, and a width is a dimension of the first scan signal line 41 in the second direction Y. A plurality of through holes may be provided on the first scan signal line 41, orthographic projections of the plurality of through holes on the base substrate are at least overlapped with orthographic projections of a first power supply line, a data signal line, and a compensation signal line formed subsequently on the base substrate, and the plurality of through holes are configured to reduce parasitic capacitances between the first scan signal line 41, and the first power supply line, the data signal line, and the compensation signal line.

In an exemplary implementation mode, a shape of the second scan signal line 42 may be a strip shape extending along the first direction X, the second scan signal line 42 may be located on a side of the second electrode plate 34 away from the first scan signal line 41, an orthographic projection of the second scan signal line 42 on the base substrate is at least partially overlapped with an orthographic projection of a third active layer 33 in each sub-pixel on the base substrate, and the second scan signal line 42 in an overlapping region may serve as a gate electrode of a third transistor T3.

In an exemplary implementation mode, the second scan signal line 42 may be arranged with unequal widths, and a width is a dimension of the second scan signal line 42 in the second direction Y. The second scan signal line 42 includes a region overlapping with the third active layer 33 and a region not overlapping with the third active layer 33. A width of the second scan signal line 42 in the region overlapping with the third active layer 33 may be smaller than a width of the second scan signal line 42 in the region not overlapping with the third active layer 33. In the region not overlapping with the third active layer 33, a plurality of through holes may be provided on the second scan signal line 42, orthographic projections of the plurality of through holes on the base substrate are at least partially overlapped with orthographic projections of a first power supply line, a data signal line, and a compensation signal line formed subsequently on the base substrate, and the plurality of through holes are configured to reduce parasitic capacitances between the second scan signal line 42, and the first power supply line, the data signal line, and the compensation signal line.

In an exemplary implementation mode, the first scan signal lines 41 and the second scan signal lines 42 may be arranged in parallel.

In an exemplary implementation mode, both the first scan signal line 41 and the second scan signal line 42 are discontinuously arranged, and in at least one sub-pixel, at least one first fracture K1 is provided on the first scan signal line 41, and at least one second fracture K2 is provided on the second scan signal line 42.

In an exemplary implementation mode, the first fracture K1 may be arranged at any one or more of following positions: a first sub-pixel P1, a second sub-pixel P2, a third sub-pixel P3, a fourth sub-pixel P4, and between the second sub-pixel P2 and the third sub-pixel P3. The second fracture K2 may be arranged at any one or more of following positions: the first sub-pixel P1, the second sub-pixel P2, the third sub-pixel P3, the fourth sub-pixel P4, and between the second sub-pixel P2 and the third sub-pixel P3.

In an exemplary implementation mode, at least one first fracture K1 may be arranged at the first sub-pixel P1, and the first fracture K1 cuts off the first scan signal line 41 to form the first scan signal line 41 with a discontinuous structure. In an exemplary implementation mode, first scan signal lines 41 on both sides of the first fracture K1 may be connected with each other through a first signal connection electrode formed subsequently to achieve transmission of a first scan signal.

In an exemplary implementation mode, at least one second fracture K2 may be arranged between the second sub-pixel P2 and the third sub-pixel P3, and the second fracture K2 cuts off the second scan signal line 42 to form the second scan signal line 42 with a discontinuous structure. In an exemplary implementation mode, second scan signal lines 42 on both sides of the second fracture K2 may be connected with each other through a second signal connection electrode formed subsequently to achieve transmission of a second scan signal.

In an exemplary implementation mode, the compensation connection electrode 83 may be arranged within the second fracture K2, and an orthographic projection of the compensation connection electrode 83 on the base substrate is at least partially overlapped with an orthographic projection of the second fracture K2 on the base substrate.

In an exemplary implementation mode, a shape of the second gate electrode 43 may be a strip shape extending along the first direction X, and the second gate electrode 43 may serve as a gate electrode of a second transistor T2. Within each sub-pixel, on one hand, an orthographic projection of the second gate electrode 43 on the base substrate is at least partially overlapped with an orthographic projection of the second active layer 32 on the base substrate, and on the other hand, the orthographic projection of the second gate electrode 43 on the base substrate is at least partially overlapped with the second region 31-2 of the first active layer 31.

In an exemplary implementation mode, a shape of the auxiliary power supply line 44 may be a stripe shape extending along the second direction Y and the auxiliary power supply line 44 may be arranged within the first sub-pixel P1 and the fourth sub-pixel P4 respectively. Within the first sub-pixel P1, the auxiliary power supply line 44 is located on a side of the second electrode plate 34 in an opposite direction of the first direction X. Within the fourth sub-pixel P4, the auxiliary power supply line 44 is located on a side of the second electrode plate 34 in the first direction X. The auxiliary power supply line 44 is configured to be connected with a first power supply line formed subsequently to form a double-layer trace to ensure reliability of transmission of a power supply signal and to reduce a resistance of the first power supply line.

In an exemplary implementation mode, a shape of the auxiliary data line 45 may be a strip shape extending along the second direction Y and the auxiliary data line 45 may be respectively arranged within each sub-pixel. Within the first sub-pixel P1 and the third sub-pixel P3, auxiliary data lines 45 are located on a side of the second electrode plate 34 in the first direction X. Within the second sub-pixel P2 and the fourth sub-pixel P4, auxiliary data lines 45 are located on a side of the second electrode plate 34 in an opposite direction of the first direction X. The auxiliary data line 45 is configured to be connected with a data signal line formed subsequently to form a double-layer trace to ensure reliability of transmission of a data signal and to reduce a resistance of the data signal line.

In an exemplary implementation mode, a shape of the auxiliary compensation line 46 may be a stripe shape extending along the second direction Y and the auxiliary compensation line 46 may be arranged between the second sub-pixel P2 and the third sub-pixel P3. The auxiliary compensation line 46 is configured to be connected with a compensation signal line formed subsequently to form a double-layer trace to ensure reliability of transmission of a compensation signal and to reduce a resistance of the compensation signal line.

In an exemplary implementation mode, main body portions of the auxiliary power supply line 44, the auxiliary data line 45, and the auxiliary compensation line 46 may be arranged in parallel.

In an exemplary implementation mode, second gate electrodes 43 within the first sub-pixel P1 and the fourth sub-pixel P4 may be mirror-symmetrically arranged with respect to the auxiliary compensation line 46, and second gate electrodes 43 within the second sub-pixel P2 and the third sub-pixel P3 may be mirror-symmetrically arranged with respect to the auxiliary compensation line 46.

In an exemplary implementation mode, auxiliary power supply lines 44 within the first sub-pixel P1 and the fourth sub-pixel P4 may be mirror-symmetrically arranged with respect to the auxiliary compensation line 46, and second scan signal lines 42 may be mirror-symmetrically arranged with respect to the auxiliary compensation line 46.

In an exemplary implementation mode, this process further includes a conductive treatment. The conductive treatment is to perform a plasma treatment by using the second conductive layer as a shield after the pattern of the second conductive layer is formed. The semiconductor layer shielded by the second conductive layer is used as a channel region of a transistor, and the semiconductor layer not shielded by the second conductive layer is processed into a conductive layer to form a conductive second electrode plate 34 and a conductive source drain region.

Figure 10:
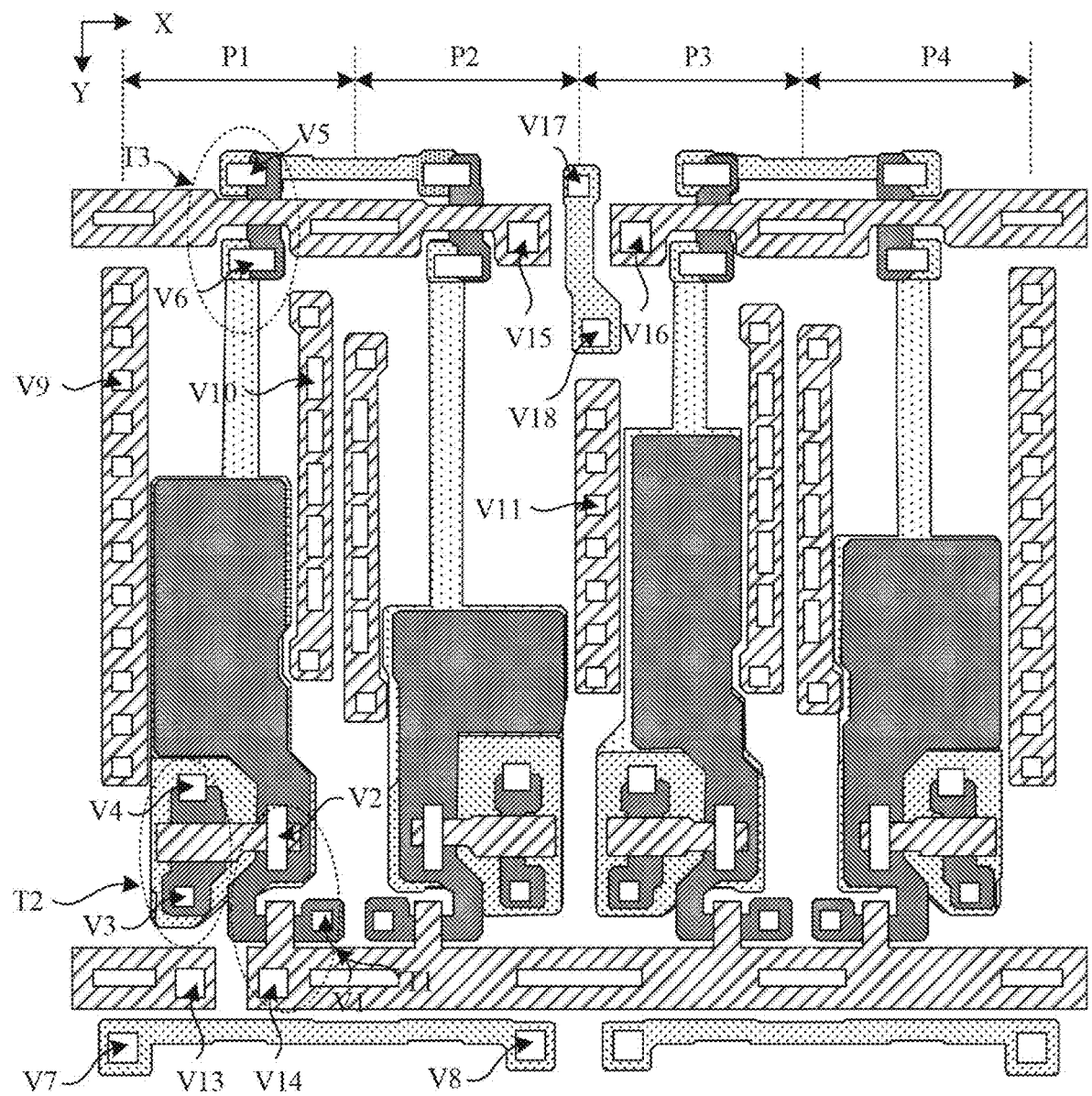
FIG. 10 is a schematic diagram after a pattern of a third insulation layer is formed according to an embodiment of the present disclosure.

(15) A pattern of a third insulation layer is formed. In an exemplary embodiment, forming the pattern of the third insulation layer may include: depositing a third insulation thin film on the base substrate on which the aforementioned patterns are formed, and patterning the third insulation thin film through a patterning process, to form the third insulation layer covering the second conductive layer, wherein a plurality of vias are provided on the third insulation layer, as shown in FIG. 10.

In an exemplary implementation mode, the plurality of vias at least include a first via V1, a second via V2, a third via V3, a fourth via V4, a fifth via V5, a sixth via V6, a seventh via V7, an eighth via V8, a ninth via V9, a tenth via V10, an eleventh via V11, a thirteenth via V13, a fourteenth via V14, a fifteenth via V15, a sixteenth via V16, a seventeenth via V17, and an eighteenth via V18.

In an exemplary embodiment, the first via V1 may be provided in each sub-pixel, and an orthographic projection of the first via V1 on the base substrate is located within a range of an orthographic projection of a first region of a first active layer on the base substrate. The third insulation layer and the second insulation layer within the first via V1 are etched away to expose a surface of the first region of the first active layer, and the first via V1 is configured such that a data signal line formed subsequently is connected with the first region of the first active layer through the via.

In an exemplary embodiment, the second via V2 may be provided in each sub-pixel, an orthographic projection of the second via V2 on the base substrate is within a range of an orthographic projection of a second region of the first active layer on the base substrate, and the orthographic projection of the second via V2 on the base substrate is at least partially overlapped with the orthographic projection of the second gate electrode 43 on the base substrate. The third insulation layer and the second insulation layer within the second via V2 are etched away, simultaneously exposing a surface of the second region of the first active layer and a surface of the second gate electrode 43. The second via V2 is a transfer via composed of two half holes, wherein one half hole is formed on the second region of the first active layer, and the other half hole is formed on the second gate electrode 43, so that the transfer via composed of two half holes exposes the surface of the second region of the first active layer and the surface of the second gate electrode 43 simultaneously. In an exemplary embodiment, the second via V2 is configured such that a second electrode of a first transistor T1 formed subsequently is connected with the second gate electrode 43 and the second region of the first active layer simultaneously through the via.

In an exemplary embodiment, the third via V3 may be provided in each sub-pixel, and an orthographic projection of the third via V3 on the base substrate is within a range of an orthographic projection of a first region of a second active layer on the base substrate. The third insulation layer and the second insulation layer within the third via V3 are etched away to expose a surface of the first region of the second active layer, and the third via V3 is configured such that a first power supply line formed subsequently is connected with the first region of the second active layer through the via.

In an exemplary embodiment, the fourth via V4 may be provided in each sub-pixel, on one hand, an orthographic projection of the fourth via V4 on the base substrate is at least partially overlapped with an orthographic projection of a second region of the second active layer on the base substrate, and on the other hand, the orthographic projection of the fourth via V4 on the base substrate is at least partially overlapped with the orthographic projection of the shield layer 23 on the base substrate. The third insulation layer, the second insulation layer, and the first insulation layer within the fourth via V4 are etched away to simultaneously expose a surface of the second region of the second active layer and a surface of the shield layer 23, and the fourth via V4 is configured such that a second electrode of a second transistor T2 formed subsequently is connected with the second region of the second active layer and the shield layer 23 simultaneously through the via.

In an exemplary embodiment, the fifth via V5 may be provided in each sub-pixel, on one hand, an orthographic projection of the fifth via V5 on the base substrate is at least partially overlapped with an orthographic projection of a first region of a third active layer on the base substrate, and on the other hand, the orthographic projection of the fifth via V5 on the base substrate is at least partially overlapped with the orthographic projection of the compensation connection line 22 on the base substrate. The third insulation layer, the second insulation layer, and the first insulation layer within the fifth via V5 are etched away to simultaneously expose a surface of the first region of the third active layer and a surface of the compensation connection line 22, and the fifth via V5 is configured such that a first electrode of a third transistor T3 formed subsequently is connected with the compensation connection line 22 and the first region of the third active layer simultaneously through the via.

In an exemplary embodiment, the sixth via V6 may be provided in each sub-pixel, on one hand, an orthographic projection of the sixth via V6 on the base substrate is at least partially overlapped with an orthographic projection of a second region of the third active layer on the base substrate, and on the other hand, the orthographic projection of the sixth via V6 on the base substrate is at least partially overlapped with the orthographic projection of the interlayer connection electrode 24 on the base substrate. The third insulation layer, the second insulation layer, and the first insulation layer within the sixth via V6 are etched away to simultaneously expose a surface of the second region of the third active layer and a surface of the interlayer connection electrode 24, and the sixth via V6 is configured such that a second electrode of the third transistor T3 formed subsequently is connected with the interlayer connection electrode 24 and the second region of the third active layer simultaneously through the via.

In an exemplary embodiment, the seventh via V7 may be provided in the first sub-pixel P1 and the fourth sub-pixel P4, and an orthographic projection of the seventh via V7 on the base substrate is located within a range of an orthographic projection of the first end of the power supply connection line 21 on the base substrate. The third insulation layer, the second insulation layer, and the first insulation layer within the seventh via V7 are etched away to expose a surface of the first end of the power supply connection line 21, and the seventh via V7 is configured such that the first power supply line formed subsequently is connected with the first end of the power supply connection line 21 through the via.

In an exemplary embodiment, the eighth via V8 may be provided in the second sub-pixel P2 and the third sub-pixel P3, and an orthographic projection of the eighth via V8 on the base substrate is located within a range of an orthographic projection of the second end of the power supply connection line 21 on the base substrate. The third insulation layer, the second insulation layer, and the first insulation layer within the eighth via V8 are etched away to expose a surface of the second end of the power supply connection line 21, and the eighth via V8 is configured such that a first electrode of the second transistor T2 formed subsequently is connected with the second end of the power supply connection line 21 through the via.

In an exemplary embodiment, the ninth via V9 may be provided in the first sub-pixel P1 and the fourth sub-pixel P4, and an orthographic projection of the ninth via V9 on the base substrate is located within a range of an orthographic projection of the auxiliary power supply line 44 on the base substrate. The third insulation layer within the ninth via V9 is etched away to expose a surface of the auxiliary power supply line 44, and the ninth via V9 is configured such that the first power supply line formed subsequently is connected with the auxiliary power supply line 44 through the via. In an exemplary embodiment, the ninth via V9 may include a plurality, and the plurality of ninth via V9 may be sequentially arranged along the second direction Y to increase reliability of a connection between the first power supply line and the auxiliary power supply line 44.

In an exemplary embodiment, the tenth via V10 may be provided in each sub-pixel, and an orthographic projection of the tenth via V10 on the base substrate is located within a range of an orthographic projection of the auxiliary data line 45 on the base substrate. The third insulation layer in the tenth via V10 is etched away to expose a surface of the auxiliary data line 45, and the tenth via V10 is configured such that the data signal line formed subsequently is connected with the auxiliary data line 45 through the via. In an exemplary embodiment, the tenth via V10 may include a plurality, and the plurality of tenth via V10 may be sequentially arranged along the second direction Y to increase reliability of a connection between the data signal line and the auxiliary data line 45.

In an exemplary embodiment, the eleventh via V11 may be provided between the second sub-pixel P2 and the third sub-pixel P3, and an orthographic projection of the eleventh via V11 on the base substrate is located within a range of an orthographic projection of the auxiliary compensation line 46 on the base substrate. The third insulation layer within the eleventh via V11 is etched away to expose a surface of the auxiliary compensation line 46, and the eleventh via V11 is configured such that the compensation signal line formed subsequently is connected with the auxiliary compensation line 46 through the via. In an exemplary embodiment, the eleventh via V11 may include a plurality, and the plurality of eleventh via V11 may be sequentially arranged along the second direction Y to increase reliability of a connection between the compensation signal line and the auxiliary compensation line 46.

In an exemplary embodiment, the thirteenth via V13 and the fourteenth via V14 may be provided in the first sub-pixel P1, an orthographic projection of the thirteenth via V13 on the base substrate may be located within a range of an orthographic projection of a first scan signal line 41 on one side of the first fracture K on the base substrate, and an orthographic projection of the fourteenth via V14 on the base substrate may be located within a range of an orthographic projection of a first scan signal line 41 on the other side of the first fracture K1 on the base substrate. The third insulation layer within the thirteenth via V13 and the fourteenth via V14 is etched away to expose surfaces of first scan signal lines 41 on both sides of the first fracture K1, respectively, and the thirteenth via V13 and the fourteenth via V14 are configured such that a first signal connection electrode formed subsequently is connected with the first scan signal lines 41 through the vias.

In an exemplary embodiment, the fifteenth via V15 may be provided in the second sub-pixel P2, the sixteenth via V16 may be provided in the third sub-pixel P3, an orthographic projection of the fifteenth via V15 on the base substrate may be located within a range of an orthographic projection of a second scan signal line 42 on one side of the second fracture K2 on the base substrate, and an orthographic projection of the sixteenth via V16 on the base substrate may be located within a range of an orthographic projection of a second scan signal line 42 on the other side of the second fracture K2 on the base substrate. The third insulation layer within the fifteenth via V15 and the sixteenth via V16 is etched away to expose surfaces of second scan signal lines 42 on both sides of the second fracture K2, respectively, and the fifteenth via V15 and the sixteenth via V16 are configured such that a second signal connection electrode formed subsequently is connected with the second scan signal lines 42 through the vias.

In an exemplary embodiment, the seventeenth via V17 may be provided between the second sub-pixel P2 and the third sub-pixel P3, an orthographic projection of the seventeenth via V17 on the base substrate may be located within a range of an orthographic projection of the first end of the compensation connection electrode 83 on the base substrate. The third insulation layer, the second insulation layer, and the first insulation layer within the seventeenth via V17 are etched away to expose a surface of the first end of the compensation connection electrode 83, and the seventeenth via V17 is configured such that the compensation signal line formed subsequently is connected with the first end of the compensation connection electrode 83 through the via.

In an exemplary embodiment, the eighteenth via V18 may be provided between the second sub-pixel P2 and the third sub-pixel P3, and an orthographic projection of the eighteenth via V18 on the base substrate may be located within a range of an orthographic projection of the second end of the compensation connection electrode 83. The third insulation layer, the second insulation layer, and the first insulation layer within the eighteenth via V18 are etched away to expose a surface of the second end of the compensation connection electrode 83, and the eighteenth via V18 is configured such that the compensation signal line formed subsequently is connected with the second end of the compensation connection electrode 83 through the via.

Figure 11A:
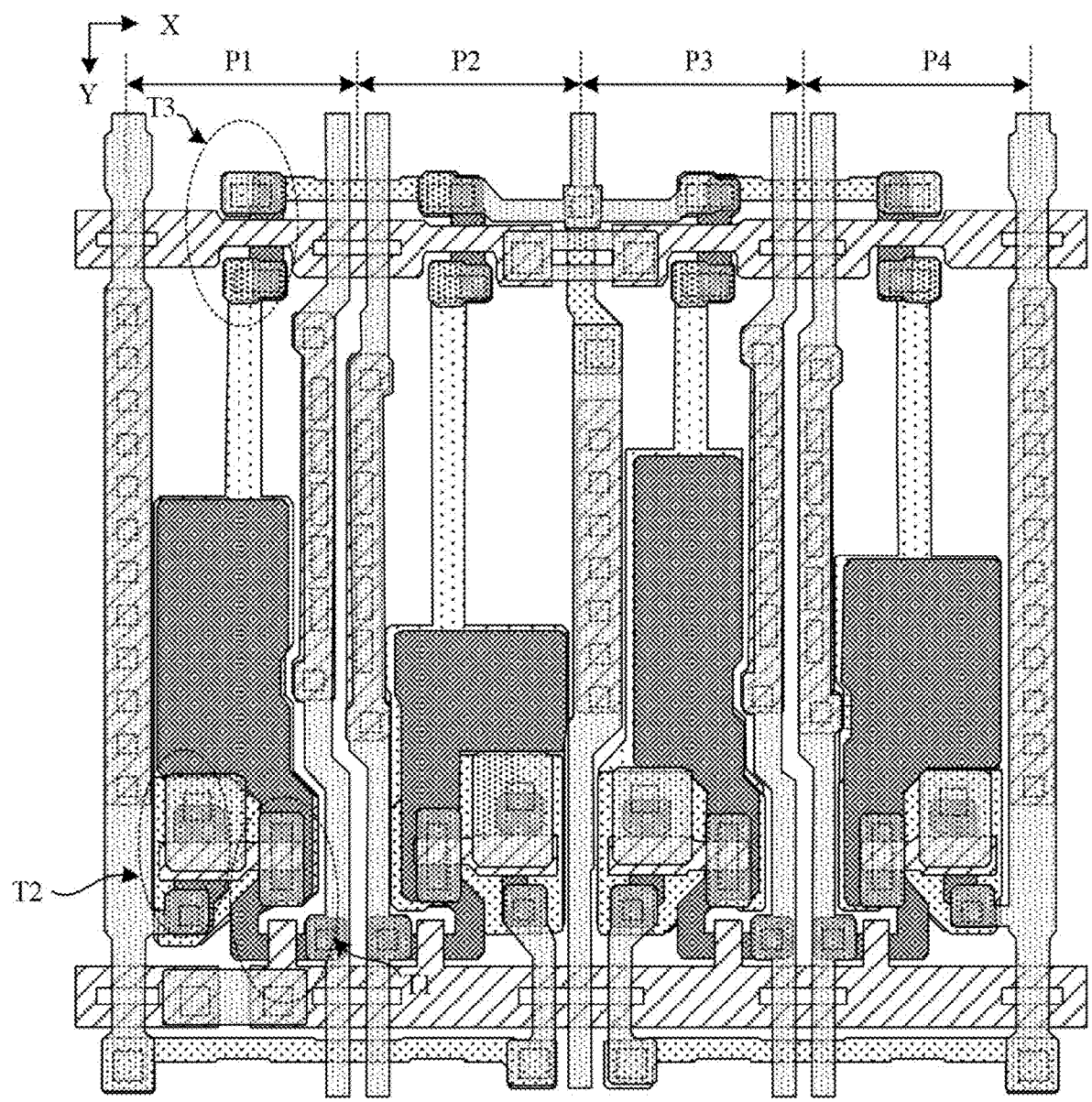
FIG. 11*a* and FIG. 11*b* are schematic diagrams after a pattern of a third conductive layer is formed according to an embodiment of the present disclosure.
Figure 11B:
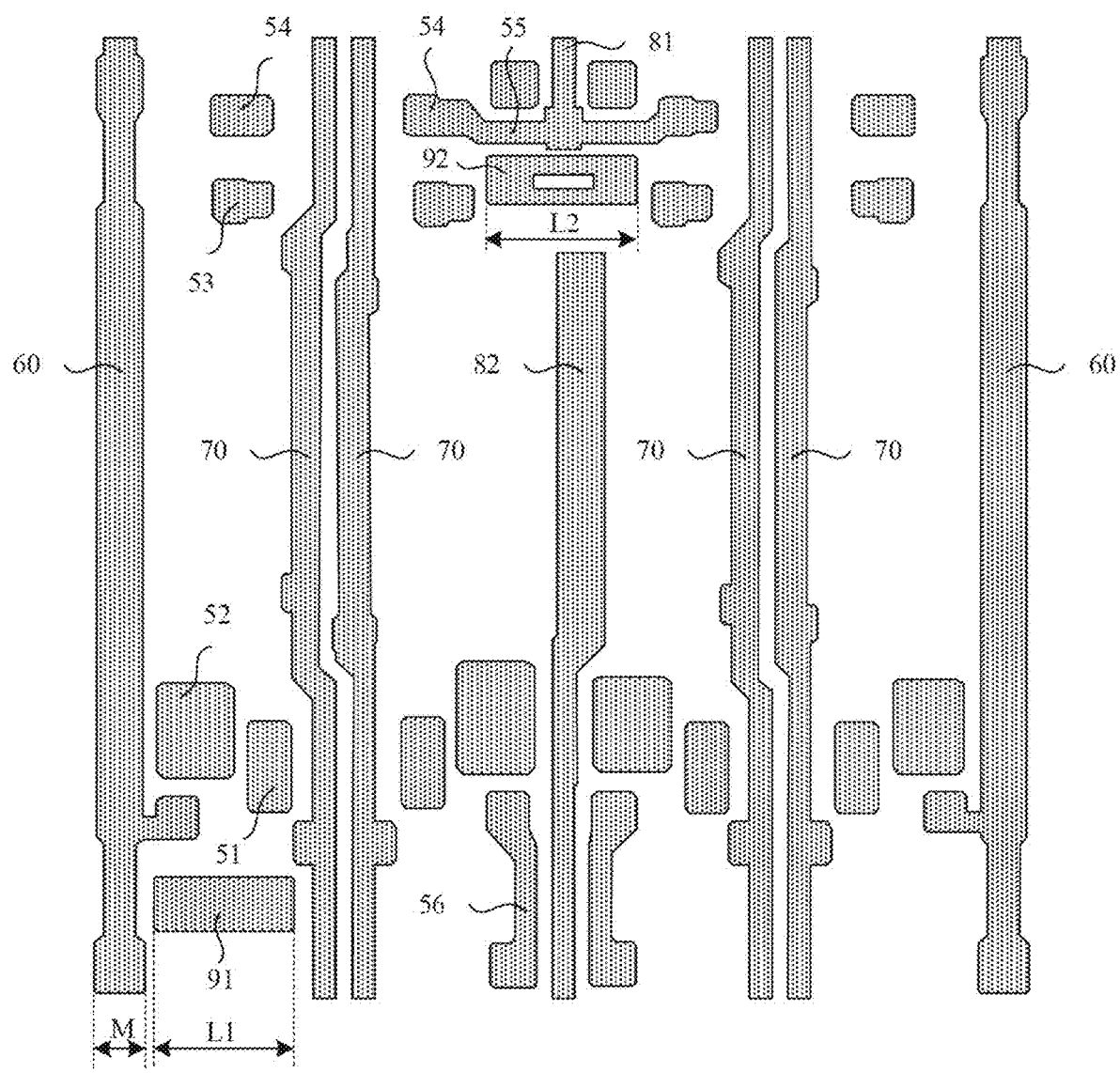

(16) A pattern of a third conductive layer is formed. In an exemplary embodiment, forming the third conductive layer may include: depositing a third conductive thin film on the base substrate on which the above-mentioned patterns are formed, and patterning the third conductive thin film through a patterning process to form the third conductive layer arranged on the third insulation layer, as shown in FIG. 11a and FIG. 11b, and FIG. 11b is a planar schematic diagram of the third conductive layer in FIG. 11a. In an exemplary embodiment, the third conductive layer may be referred to as a Source Drain metal (SD) layer.

In an exemplary implementation mode, a pattern of a third conductive layer in each pixel unit at least includes a first connection electrode 51, a second connection electrode 52, a third connection electrode 53, a fourth connection electrode 54, a fifth connection electrode 55, a sixth connection electrode 56, a first power supply line 60, a data signal line 70, a compensation signal line 80, a first signal connection electrode 91, and a second signal connection electrode 92.

In the exemplary embodiment, the first power supply line 60 may be provided in the first sub-pixel P1 and the fourth sub-pixel P4 respectively, and a shape of the first power supply line 60 may be a linear shape of which a main body portion extends along the second direction Y. On one hand, the first power supply line 60 is connected with the first region of the second active layer through the third via V3 to achieve that a power supply signal is written into the second transistor T2, and on the other hand, the first power supply line 60 is connected with the first end of the power supply connection line 21 through the seventh via V7 and the first power supply line 60 transmits the power supply signal to the power supply connection line 21, so that the power supply connection line 21 may transmit the power supply signal to the second sub-pixel P2 and the third sub-pixel P3, respectively. On another hand, the first power supply line 60 is connected with the auxiliary power supply line 44 through the plurality of ninth vias V9, so that the first power supply line 60 and the auxiliary power supply line 44 form a double-layer trace.

In an exemplary implementation mode, the first power supply line 60 may be a straight line or a fold line with an equal width, or a straight line or a fold line with unequal widths, and using a straight line or a fold line with a variable width may not only facilitate a layout of a pixel structure, but also reduce a parasitic capacitance.

In an exemplary embodiment, data signal lines 70 are respectively provided in each sub-pixel and a shape of a data signal line 70 may be a linear shape of which a main portion extends along the second direction Y. On one hand, the data signal line 70 is connected with the first region of the first active layer through the first via V1, so that a data signal is written to the first transistor T1, and on the other hand, the data signal line 70 is connected with the auxiliary data line 45 through the plurality of tenth vias V10, so that the data signal line 70 and the auxiliary data line 45 form a double-layer track.

In an exemplary implementation mode, the data signal line 70 may be a straight line or a fold line with an equal width, or a straight line or a fold line with unequal widths, and using a straight line or a fold line provided with a variable width may not only facilitate a layout of a pixel structure, but also reduce a parasitic capacitance.

In an exemplary embodiment, the compensation signal line is arranged between the second sub-pixel P2 and the third sub-pixel P3, and the compensation signal line may include a first compensation signal line 81 and a second compensation signal line 82 respectively arranged on both sides of the second signal connection electrode 92 in the second direction Y, wherein shapes of the first compensation signal line 81 and the second compensation signal line 82 may be strip shapes of which main body portions extend along the second direction Y to form compensation signal lines arranged at intervals.

In an exemplary embodiment, the first compensation signal line 81 is connected with the first end of the compensation connection electrode 83 through the seventeenth via V17, and the second compensation signal line 82 is connected with the second end of the compensation connection electrode 83 through the eighteenth via V18, so that the first compensation signal line 81 and the second compensation signal line 82 on both sides of the second signal connection electrode 92 are connected with each other through the compensation connection electrode 83.

In an exemplary embodiment, the second compensation signal line 82 may also be connected with the auxiliary compensation line 46 through the plurality of eleventh vias V11, such that the second compensation signal line 82 and the auxiliary compensation line 46 form a double-layer trace.

In an exemplary implementation mode, the first compensation signal line 81 and the second compensation signal line 82 may be straight lines or fold lines with an equal width, or straight lines or fold lines with unequal widths, and using a straight line or a fold line with a variable width may not only facilitate a layout of a pixel structure, but also reduce a parasitic capacitance.

In an exemplary embodiment, a shape of the first connection electrode 51 may be a rectangular shape and first connection electrodes 51 may be arranged in each sub-pixel respectively, and a first connection electrode 51 in each sub-pixel is connected with the second region of the first active layer and the second gate electrode simultaneously through the second via V2. In an exemplary embodiment, the first connection electrode 51 may serve as a second electrode of a first transistor T1, and since the second region of the first active layer is connected with the second electrode plate 34, the first connection electrode 51 enables the second electrode of the first transistor T1, the second gate electrode 43, and the second electrode plate 34 to have a same potential, i.e., a potential of a first node N1 in a pixel drive circuit.

In an exemplary embodiment, a shape of the second connection electrode 52 may be a rectangular shape and second connection electrodes 52 may be respectively arranged in each sub-pixel, and a second connection electrode 52 in each sub-pixel is connected with the second region of the second active layer and the shield layer 23 simultaneously through the fourth via V4. In an exemplary embodiment, the second connection electrode 52 may serve as a second electrode of a second transistor T2, and since the shield layer 23 is connected with the connection plate 12 and the connection plate 12 is connected with the first electrode plate 11, the second connection electrode 52 enables the second electrode of the second transistor T2 and the first electrode plate 11 to have a same potential.

In an exemplary embodiment, a shape of the third connection electrode 53 may be a rectangular shape and third connection electrodes 53 may be respectively arranged in each sub-pixel, and a third connection electrode 53 in each sub-pixel is connected with the second region of the third active layer and the interlayer connection electrode simultaneously through the sixth via V6. In an exemplary embodiment, the third connection electrode 53 may serve as a second electrode of a third transistor T3, and since the interlayer connection electrode 24 is connected with the connection line 13 and the connection line 13 is connected with the first electrode plate 11, the third connection electrode 53 enables the second electrode of the third transistor T3 and the first electrode plate 11 to have a same potential.

In an exemplary embodiment, since the second connection electrode 52 enables the first electrode plate 11 and the second electrode of the second transistor T2 to have a same potential, the third connection electrode 53 enables the first electrode plate 11 and the second electrode of the third transistor T3 to have a same potential, so that the second electrode of the second transistor T2, the second electrode of the third transistor T3, and the first electrode plate 11 have a same potential, i.e., a potential of a second node N2 in the pixel drive circuit.

In an exemplary embodiment, a shape of the fourth connection electrode 54 may be a rectangular shape and fourth connection electrodes 54 may be respectively arranged in each sub-pixel, and a fourth connection electrode 54 in each sub-pixel is connected with the first region of the third active layer and the compensation connection line 22 simultaneously through the fifth via V5 of the sub-pixel. In an exemplary embodiment, the fourth connection electrode 54 may serve as the first electrode of the third transistor T3, and since the compensation connection line 22 is connected with the first compensation signal line 81, the fourth connection electrode 54 may write a compensation signal into the first electrode of the third transistor T3 of each sub-pixel.

In an exemplary embodiment, a shape of the fifth connection electrode 55 may be a strip shape extending along the first direction X and fifth connection electrodes 55 may be arranged in the second sub-pixel P2 and the third sub-pixel P3, respectively. A first end of a fifth connection electrode 55 is connected with the first compensation signal line 81, and a second end of the fifth connection electrode 55 extends to the second sub-pixel P2 along an opposite direction of the first direction X or extends to the third sub-pixel P3 along the first direction X and is connected with a fourth connection electrode 54 of a sub-pixel where the fifth connection electrode 55 is located. In an exemplary embodiment, the fifth connection electrode 55 may serve as an auxiliary connection line, and since the fifth connection electrode 55 is connected with the first compensation signal line 81, the fourth connection electrode 54 is connected with the fifth connection electrode 55, and the compensation connection line 22 is connected with the fourth connection electrode 54, a connection between the compensation connection line 22 and the first compensation signal line 81 is achieved, and the first compensation signal line 81 transmits a compensation signal to the compensation connection line 22.

In an exemplary embodiment, the first compensation signal line 81, the fourth connection electrode 54, and the fifth connection electrode 55 in the second sub-pixel P2 and the third sub-pixel P3 may be of an integral structure connected with each other.

In an exemplary embodiment, a shape of the sixth connection electrode 56 may be a strip shape extending along the second direction Y and sixth connection electrodes 56 may be arranged in the second sub-pixel P2 and the third sub-pixel P3, respectively. A first end of a sixth connection electrode 56 is connected with the power supply connection line 21 through the eighth via V8, and a second end of the sixth connection electrode 56 is connected with the first region of the second active layer through the third via V3 of the sub-pixel. In an exemplary embodiment, the sixth connection electrode 56 may serve as the first electrode of the second transistor T2, and since the power supply connection line 21 is connected with the first power supply line 60, the sixth connection electrode 56 may write a power supply signal to first electrodes of second transistors T2 of the second sub-pixel P2 and the third sub-pixel P3.

In an exemplary embodiment, a shape of the first signal connection electrode 91 may be a strip shape extending along the first direction X and the first signal connection electrode 91 may be arranged in the first sub-pixel P1. A first end of the first signal connection electrode 91 is connected with a first scan signal line 41 located on a side of the first fracture K1 through the thirteenth via V13, and a second end of the first signal connection electrode 91 is connected with a first scan signal line 41 located on the other side of the first fracture K1 through the fourteenth via V14, so that first scan signal lines 41 on both sides of the first fracture K1 are connected with each other through the first signal connection electrode 91.

In an exemplary implementation mode, the first signal connection electrode 92 may have a first length L1, and the first power supply line 60 may have a width M. The first length L1 may be a dimension of the first signal connection electrode 91 in the first direction X, i.e., a dimension in an extending direction of the first signal connection electrode 91. The width M may be a dimension of the first power supply line 60 in the second direction Y, i.e., a dimension perpendicular to the extending direction of the first power supply line 60. In an exemplary implementation mode, the width M may be a maximum dimension of the first power supply line 60 in the second direction Y, or the width M may be an average dimension of the first power supply line 60 in the second direction Y.

In an exemplary implementation mode, the first length L1 of the first signal connection electrode 91 may be greater than the width M of the first power supply line 60.

In an exemplary implementation mode, at least one sub-pixel has a width of the sub-pixel, the width of the sub-pixel may be a dimension of the sub-pixel in the first direction X, and the first length L1 of the first signal connection electrode 91 may be less than the width of the sub-pixel.

In an exemplary implementation mode, the first length L1 of the first signal connection electrode 91 may be about 50% to 80% of the width of the sub-pixel.

In an exemplary embodiment, a shape of the second signal connection electrode 92 may be a strip shape extending along the first direction X and the second signal connection electrode 92 may be arranged between the second sub-pixel P2 and the third sub-pixel P3. A first end of the second signal connection electrode 92 is connected with a second scan signal line 42 on one side of the second fracture K2 through the fifteenth via V15, a second end of the second signal connection electrode 92 is connected with a second scan signal line 42 on the other side of the second fracture K2 through the sixteenth via V16, so that second scan signal lines 42 on both sides of the second fracture K2 are connected with each other through the second signal connection electrode 92.

In an exemplary embodiment, at least one through hole may be provided on the second signal connection electrode 92, and an orthographic projection of the through hole on the base substrate and a through hole of the compensation connection electrode 83 are configured to reduce a parasitic capacitance between the second signal connection electrode 92 and the compensation connection electrode 83, that is, to reduce a parasitic capacitance between a second scan signal line and a compensation signal line.

In an exemplary implementation mode, the second signal connection electrode 92 has a second length L2, wherein the second length L2 may be a dimension of the second signal connection electrode 92 in the first direction X, i.e., a dimension in an extending direction of the second signal connection electrode 92.

In an exemplary implementation mode, the second length L2 of the second signal connection electrode 92 may be greater than the width M of the first power supply line 60.

In an exemplary implementation mode, the second length L2 of the second signal connection electrode 92 may be less than the width of the sub-pixel.

In an exemplary implementation mode, the second length L2 of the second signal connection electrode 92 may be about 50% to 80% of the width of the sub-pixel.

According to the exemplary embodiment of the present disclosure, it is achieved that data signals are written into first electrodes of first transistors T1 of four sub-pixels respectively by providing a data signal line 70 extending along the second direction Y in each sub-pixel and connecting the data signal line 70 with a first transistor T1 of a present sub-pixel through a via.

According to the exemplary embodiment of the present disclosure, it is achieved that power supply signals are written into second transistors T2 of four sub-pixels respectively by providing two first power supply lines 60 extending along the second direction Y and two power supply connection lines 21 extending along the first direction X in a pixel unit. Among them, in the first sub-pixel P1 and the fourth sub-pixel P4, the first power supply lines 60 are directly connected with first electrodes of second transistors T2 through vias, respectively. In the second sub-pixel P2 and the third sub-pixel P3, the first power supply lines 60 are connected with first electrodes of second transistors T2 through sixth connection electrodes 56, respectively.

According to the exemplary embodiment of the present disclosure, it is achieved that compensation signals are written into third transistors T3 of four sub-pixels respectively by providing one compensation signal line 81 of which a main body portion extends along the second direction Y (the first compensation signal 81 and the second compensation signal 82 connected through the compensation connection electrode 83) and two compensation connection lines 22 extending along the first direction X in a pixel unit. Among them, in the second sub-pixel P2 and the third sub-pixel P3, the compensation signal line is connected with first electrodes of third transistors T3 through the fifth connection electrode 55 and the fourth connection electrode 54, respectively. In the first sub-pixel P1 and the fourth sub-pixel P4, the compensation signal line is connected with first electrodes of third transistors T3 through the compensation connection line 22 and the fourth connection electrode 54, respectively. According to the present disclosure, compensation signals are provided to four sub-pixels by disposing one compensation signal line, and it may be ensured that Resistor-Capacitor (RC) delay of the compensation signals is substantially the same before being written into a transistor, thus ensuring display uniformity.

According to the exemplary embodiment of the present disclosure, at least one first fracture is provided with on the first scan signal line, and first scan signal lines on both sides of the first fracture are connected with each other through the first signal connection electrode. Compared with a display substrate in which a continuous scan signal line is adopted, in the exemplary embodiment of the present disclosure, the first scan signal line is divided into a plurality of segments and a first length of the first signal connection electrode is larger than a width of the first power supply line, which not only effectively reduces an amount of static electricity generated by a scan signal line in a dry etching process, but also avoids a case of breakdown of a channel of a transistor caused by static electricity accumulation, effectively avoids occurrence of edge dark spots in a display apparatus, and improves a yield and display quality on a premise of ensuring continuous transmission of a first scan signal.

According to the exemplary embodiment of the present disclosure, at least one second fracture is provided with on the second scan signal line, and second scan signal lines on both sides of the second fracture are connected with each other through the second signal connection electrode. Compared with a display substrate in which a continuous scan signal line is adopted, in the exemplary embodiment of the present disclosure, the second scan signal line is divided into a plurality of segments, and a second length of the second signal connection electrode is larger than a width of the second power supply line, which not only effectively reduces an amount of static electricity generated by a scan signal line in a dry etching process, but also avoids a case of breakdown of a channel of a transistor caused by static electricity accumulation, effectively avoids occurrence of edge dark spots in a display apparatus, and improves a yield and display quality on a premise of ensuring continuous transmission of a second scan signal.

According to the exemplary embodiment of that present disclosure, the second fracture is arranged between the second sub-pixel P2 and the third sub-pixel P3, and the compensation signal line is divided into a plurality of segments, and compensation signal lines are connected with each other through the compensation connection electrode, which effectively reduces an amount of static electricity generated by a compensation signal line in a dry etching process, and avoids a case of breakdown of a channel of a transistor caused by static electricity accumulation, effectively avoids occurrence of edge dark spots in a display apparatus, and improves a yield and display quality on a premise of ensuring continuous transmission of a compensation signal.

Figure 12:
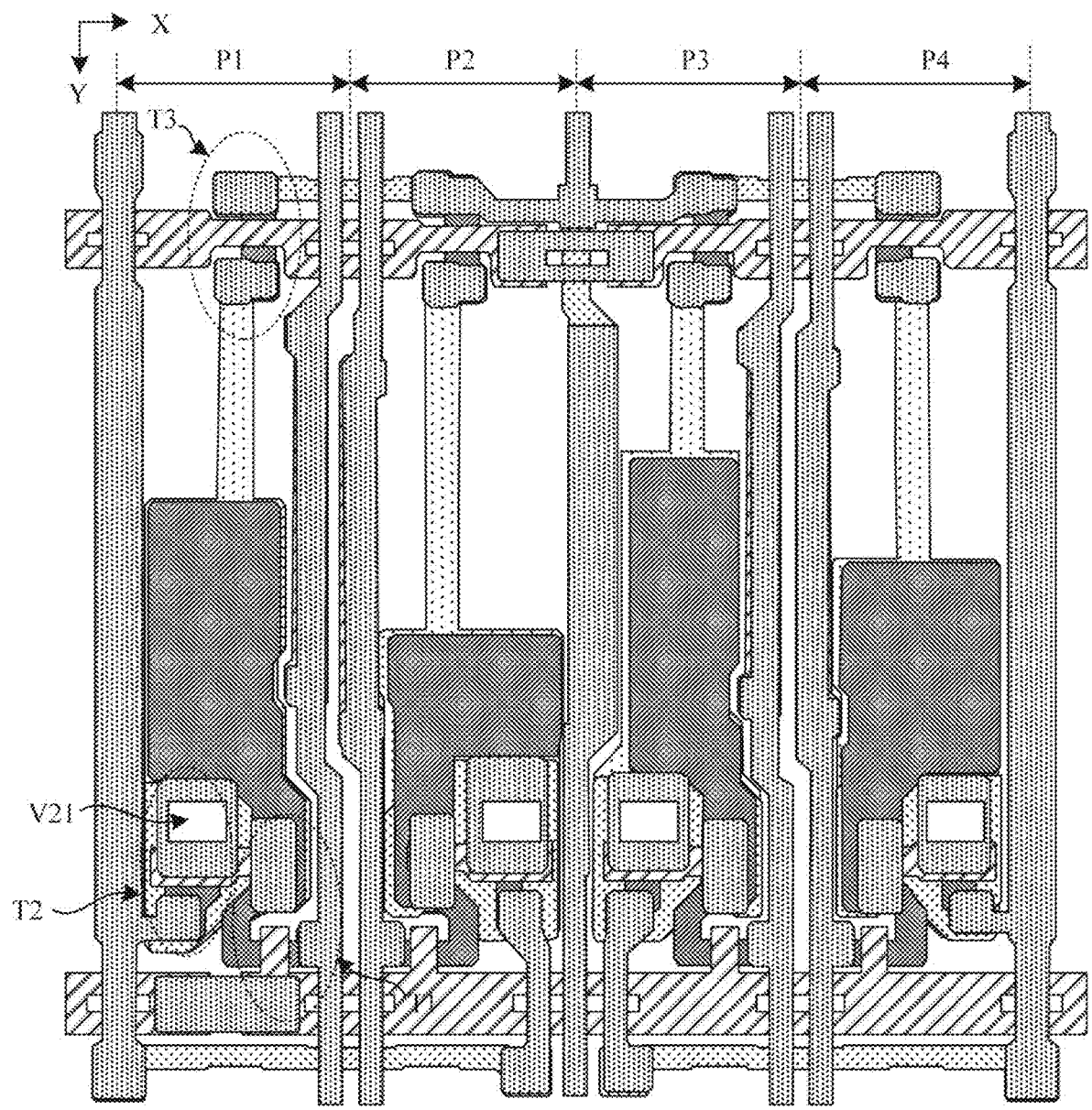
FIG. 12 is a schematic diagram after a pattern of a planarization layer is formed according to an embodiment of the present disclosure.

(17) A pattern of a planarization layer is formed. In an exemplary embodiment, forming the pattern of the planarization layer may include: coating a planarization thin film on the base substrate on which the aforementioned patterns are formed, patterning the planarization thin film through a patterning process to form the pattern of the planarization layer covering the third conductive layer, wherein the planarization layer is provided with a plurality of vias, and the plurality of vias at least include a twenty-first via V21 located in each sub-pixel, as shown in FIG. 12.

In an exemplary implementation mode, an orthographic projection of the twenty-first via V21 on the base substrate is within a range of an orthographic projection of the second connection electrode 52 on the base substrate, the planarization layer within the twenty-first via V21 is etched away to expose a surface of the second connection electrode 52, and the twenty-first via V21 is configured such that an anode formed subsequently is connected with the second connection electrode 52 through the via.

In an exemplary implementation mode, the display substrate may include a fourth insulation layer and a color film layer. The fourth insulation layer is formed first on the base substrate on which the aforementioned patterns are formed, then the color film layer is formed on the fourth insulation layer, a planarization thin film is coated subsequently, and the planarization thin film and a fourth insulation thin film are patterned through a patterning process to form the fourth insulation layer covering the third conductive layer, the color film layer arranged on the fourth insulation layer, and the pattern of the planarization layer covering the color film layer, wherein a plurality of vias are provided on the planarization layer and the fourth insulation layer.

Figure 13:
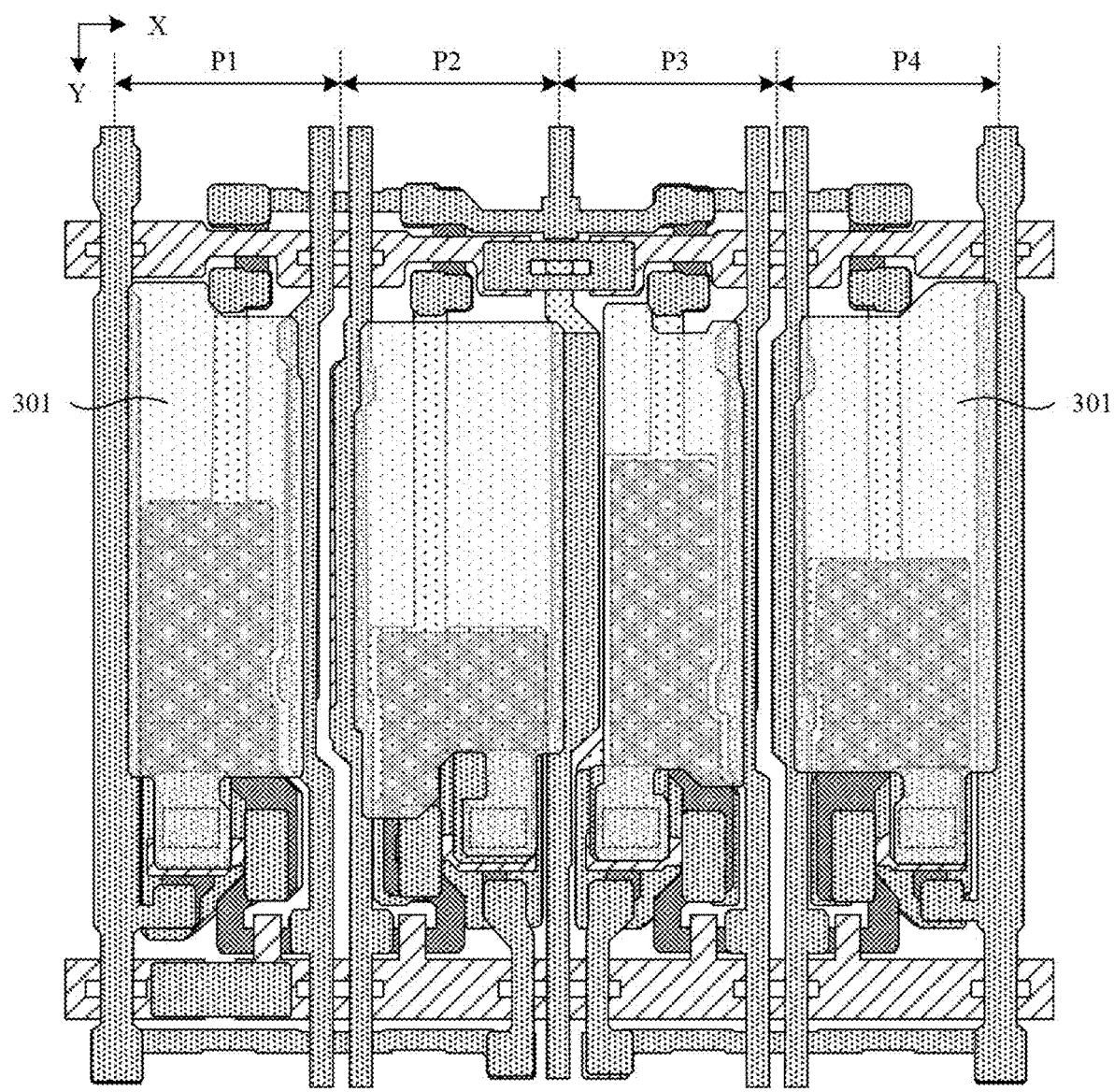
FIG. 13 is a schematic diagram after a pattern of an anode conductive layer is formed according to an embodiment of the present disclosure.

(18) A pattern of an anode conductive layer is formed. In an exemplary embodiment, forming the pattern of the anode conductive layer may include: depositing an anode conductive thin film on the base substrate on which the aforementioned patterns are formed, and patterning the anode conductive thin film through a patterning process to form the pattern of the anode conductive layer arranged on the planarization layer, wherein the pattern of the anode conductive layer at least includes an anode 301 located in each sub-pixel, as shown in FIG. 13.

In an exemplary implementation mode, the pattern of the anode conductive layer may include a red anode located in the first sub-pixel P1, a white anode located in the second sub-pixel P2, a blue anode located in the third sub-pixel P3, and a green anode located in the fourth sub-pixel P4, wherein an anode in each sub-pixel is connected with the second connection electrode 52 through the twenty-first via V21. Since the second connection electrode 52 is used as the second electrode of the second transistor T2, a connection between the anode 301 and the second electrode of the second transistor T2 is achieved.

In an exemplary implementation mode, the anode 301 may be in a strip shape extending along the second direction Y, and a protrusion is provided on one side of an anode in each sub-pixel in the second direction Y, and the protrusion is connected with the second connection electrode 52 through the twenty-first via V21.

In an exemplary implementation mode, an orthographic projection of an anode in each sub-pixel on the base substrate contains an orthographic projection of a storage capacitance in a sub-pixel where the anode is located on the base substrate.

Figure 14:
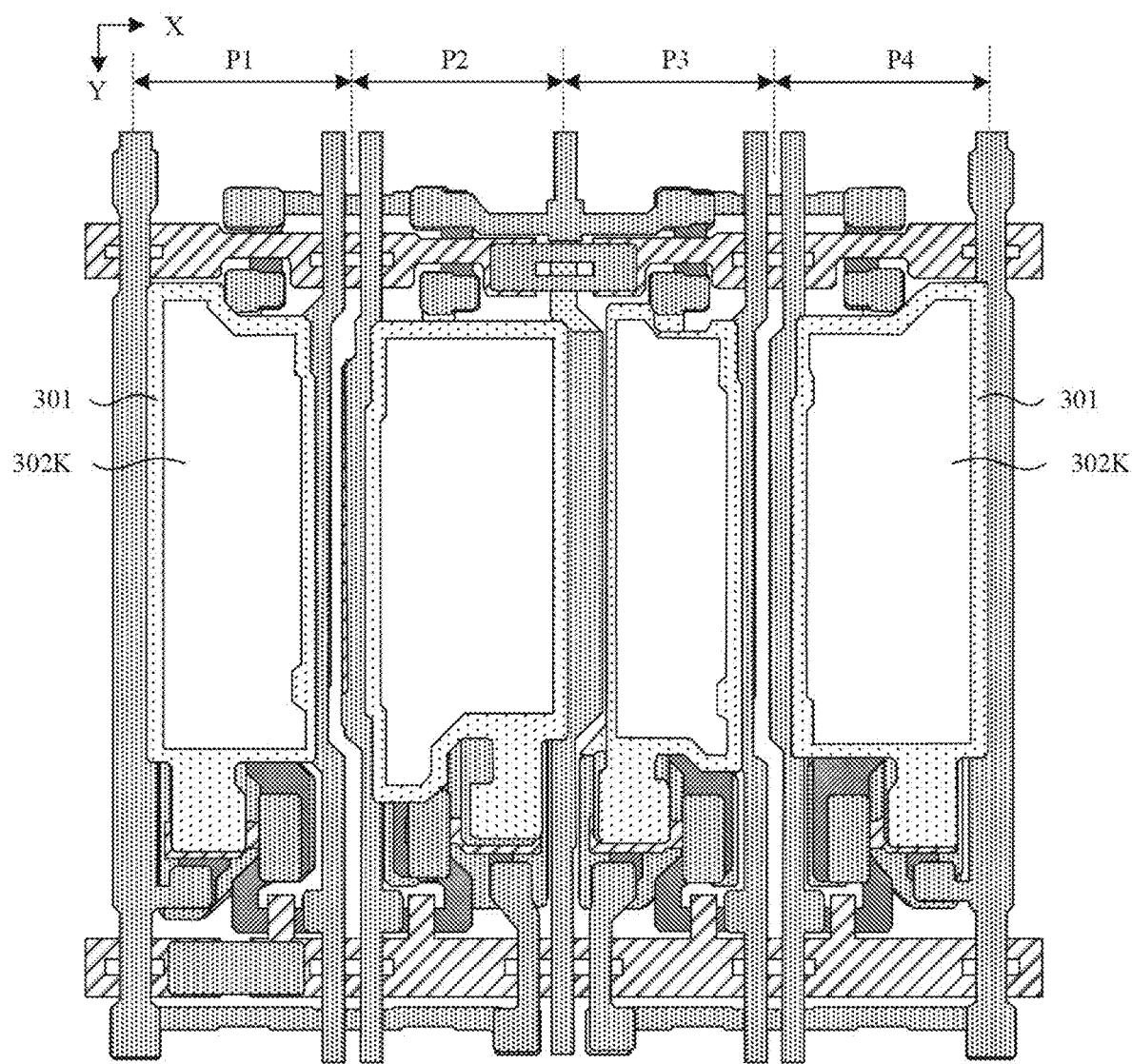
FIG. 14 is a schematic diagram after a pattern of a pixel definition layer is formed according to an embodiment of the present disclosure.

(19) A pattern of a pixel definition layer is formed. In an exemplary embodiment, forming the pattern of the pixel definition layer may include: coating a pixel definition thin film on the base substrate on which the aforementioned patterns are formed, and patterning the pixel definition thin film through a patterning process to form the pattern of the pixel definition layer, and the pattern of the pixel definition layer at least includes a pixel opening 302K located in each sub-pixel, as shown in FIG. 14.

In an exemplary embodiment, shapes and areas of pixel openings 302K of different sub-pixels may be different. In the exemplary embodiment of the present disclosure, four sub-pixels are designed with different aperture ratios, transmittances of color film layers of different sub-pixels may be adapted, so that light emitting devices of the four sub-pixels may emit same brightness at different currents, service life of the light emitting devices of the four sub-pixels is optimized to a maximum extent, and thereby ensuring service life of a product.

In an exemplary implementation mode, shapes of pixel openings of the four sub-pixels may be the same or different, and areas of the pixel openings of the four sub-pixels may be the same or different.

In an exemplary implementation mode, a shape of a pixel opening may include any one or more of following: a triangle, a rectangle, a trapezoid, a parallel four-frame shape, a five-frame shape, a six-frame shape, a circle, and an ellipse.

In an exemplary embodiment, an orthographic projection of a pixel opening 302K in each sub-pixel on the base substrate is at least partially overlapped with an orthographic projection of a storage capacitor of a sub-pixel where the pixel opening 302K is located on the base substrate.

In an exemplary embodiment, an orthographic projection of a storage capacitor in each sub-pixel on the base substrate may be within a range of an orthographic projection of a pixel opening 302K in a sub-pixel where the storage capacitor is located on the base substrate.

In an exemplary embodiment, a subsequent preparation process may include: forming an organic emitting layer using an evaporation or inkjet printing process, wherein the organic emitting layer is connected with an anode through a pixel opening, and forming a cathode on the organic emitting layer, wherein the cathode is connected with the organic emitting layer. An encapsulation structure layer is formed, and the encapsulation structure layer may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is arranged between the first encapsulation layer and the third encapsulation layer, so that it may be ensured that external water vapor cannot enter a light emitting structure layer.

So far, the drive circuit layer, the light emitting structure layer arranged on the drive circuit layer, and the encapsulation structure layer arranged on the light emitting structure layer have been prepared on the base substrate. In a plane perpendicular to the display substrate, the drive circuit layer may include a transparent conductive layer, a first conductive layer, a first insulation layer, a semiconductor layer, a second insulation layer, a second conductive layer, a third insulation layer, a third conductive layer, and a planarization layer that are sequentially stacked on the base substrate. The light emitting structure layer may include an anode, a pixel definition layer, an organic emitting layer, and a cathode, and the encapsulation structure layer may include a first encapsulation layer, a second encapsulation layer, and a third encapsulation layer which are stacked.

In an exemplary implementation mode, the base substrate may be a flexible base substrate, or may be a rigid base substrate. The rigid base substrate may be made of, but is not limited to, one or more of glass and quartz, and the flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation mode, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (PI), Polyethylene Terephthalate (PET), or a surface-treated polymer soft film, or the like. Materials of the first inorganic material layer and the second inorganic material layer may be Silicon Nitride (SiNx) or Silicon Oxide (SiOx), or the like, for improving water and oxygen resistance of the base substrate. A material of the semiconductor layer may be amorphous silicon (a-si).

In an exemplary implementation mode, the transparent conductive layer and the anode conductive layer may be made of a transparent conductive material, such as Indium Tin Oxide (ITO) and Indium Zinc Oxide (IZO). The first conductive layer, the second conductive layer, and the third conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, and the third insulation layer may be made of any one or more of Silicon Oxide (SiOx), Silicon Nitride (SiNx), and Silicon Oxynitride (SiON), and may be a single-layer, a multi-layer, or a composite layer. The first insulation layer is referred to as a Buffer layer, the second insulation layer is referred to as a Gate Insulator (GI), and the third insulation layer is referred to as an Interlayer Dielectric (ILD) layer. The planarization layer may be made of an organic material such as a resin, and the pixel definition layer may be made of polyimide, acrylic, or polyethylene terephthalate.

As shown in FIG. 6 to FIG. 14, a display substrate according to an exemplary embodiment of the present disclosure may include: a base substrate; a transparent conductive layer arranged on the base substrate, the transparent conductive layer at least including a first electrode plate 11; a first conductive layer arranged on the transparent conductive layer, the first conductive layer at least including a power supply connection line 21, a compensation connection line 22, a shield layer 23 which is connected with the first electrode plate 11, and a compensation connection electrode 83; a first insulation layer covering the first conductive layer; a semiconductor layer arranged on the first insulation layer, the semiconductor layer at least including a first active layer 31, a second active layer 32, a third active layer 33, and a second electrode plate 34, wherein the first active layer 31 and the second electrode plate 34 may be of an integral structure connected with each other, and the second electrode plate 34 and the first electrode plate 11 constitute a transparent storage capacitor; a second insulation layer covering the semiconductor layer; a second conductive layer arranged on the second insulation layer, the second conductive layer at least including a first scan signal line 41, a second scan signal line 42, and a second gate electrode 43, wherein at least one first fracture K1 is provided on the first scan signal line 41, and at least one second fracture K2 is provided on the second scan signal line 42; a third insulation layer covering the second conductive layer, a plurality of vias being provided on the third insulation layer; a third conductive layer arranged on the third insulation layer, the third conductive layer at least including a first power supply line 60, a data signal line 70, a first compensation signal line 81 and a second compensation signal line 82 of a compensation signal line, a first signal connection electrode 91, and a second signal connection electrode 92, wherein the first signal connection electrode 91 is connected with first scan signal lines 41 on both sides of the first fracture K1, the second signal connection electrode 92 is connected with second scan signal lines 42 on both sides of the second fracture K2, and the first compensation signal line 81 and the second compensation signal line 82 are connected with each other through the compensation connection electrode 83; a planarization layer which covers the third conductive layer, the planarization layer being provided with a plurality of vias; an anode conductive layer arranged on the planarization layer, the anode conductive layer at least including an anode 301; and a pixel definition layer, the pixel definition layer being provided with a pixel opening 302K exposing the anode 301.

With development of display technologies, a display apparatus with a super-large size is more and more widely used. The research shows that due to a relatively long scan line of the display apparatus with the super-large size, a large amount of static electricity will appear in a dry etching process, and static electricity concentration will break down a channel of a transistor, resulting in edge dark spots on a panel and affecting a product yield. An exemplary embodiment of the present disclosure provides a display substrate in which a scan signal line is divided into a plurality of segments, wherein at least one first fracture is provided on a first scan signal line, first scan signal lines on both sides of the first fracture are connected with each other through a first signal connection electrode, at least one second fracture is provided on a second scan signal line, and second scan signal lines on both sides of the second fracture are connected with each other through a second signal connection electrode, which not only effectively reduces an amount of static electricity generated by a scan signal line in a dry etching process, but also avoids a case of breakdown of a channel of a transistor caused by static electricity accumulation, effectively avoids occurrence of edge dark spots in a display apparatus, and improves a yield and display quality on a premise of ensuring continuous transmission of a scan signal.

According to the display substrate of the exemplary embodiment of the present disclosure, a transparent storage capacitor is adopted, the transparent storage capacitor consists of a transparent conductive layer which is transparent and a transparent semiconductor layer, and since light may be emitted through the transparent storage capacitor, the storage capacitor may be arranged in a pixel opening, which effectively increases an amount of capacitance of the storage capacitor and increases an aperture ratio of a pixel. The preparation process according to the present disclosure may be implemented using existing mature preparation equipment, and has little improvement on an existing process, and may be well compatible with an existing preparation process, thereby having simple process achievement, easy implementation, a high production efficiency, a low production cost, and a high yield.

Figure 15:
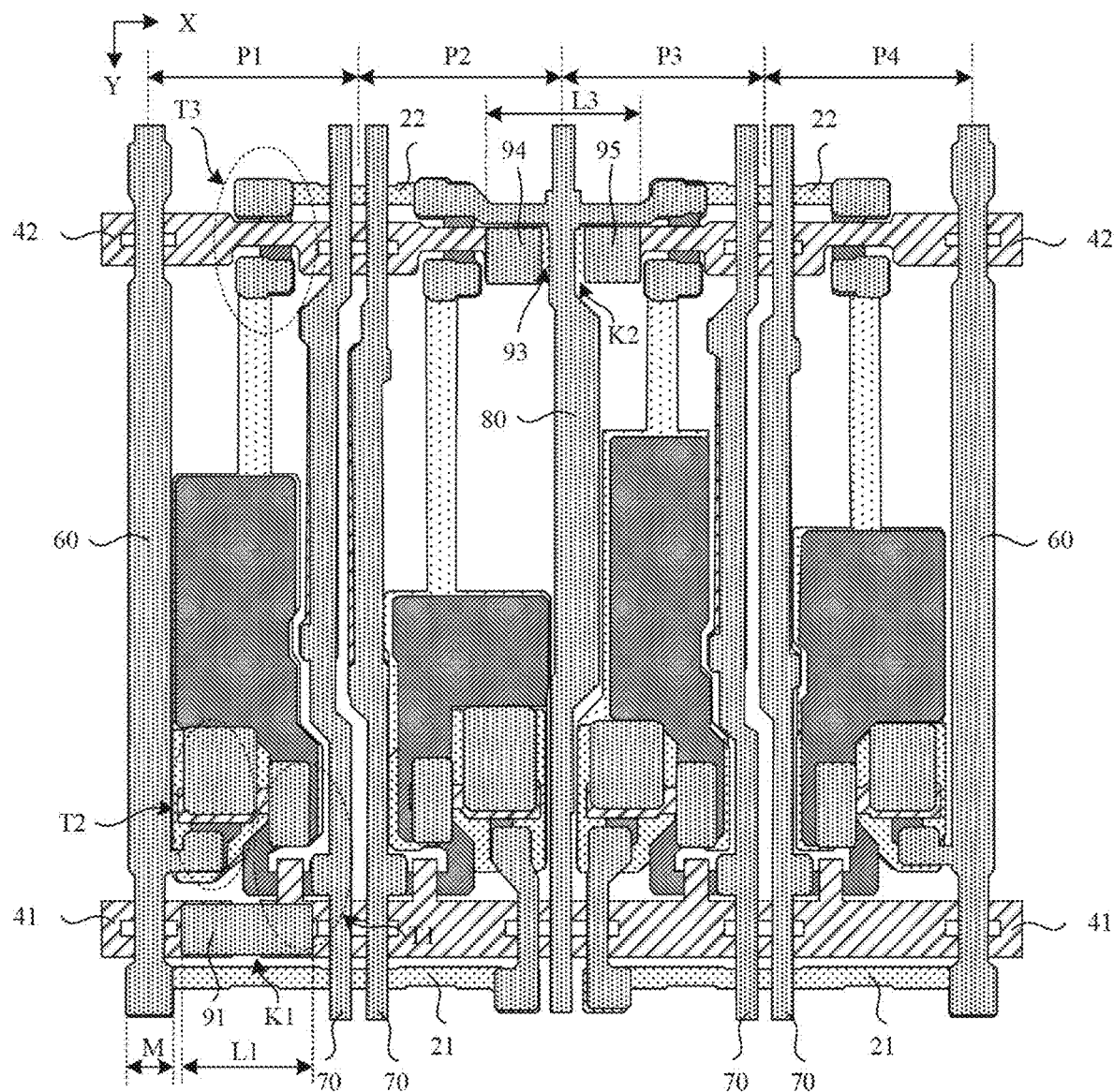
FIG. 15 is a schematic diagram of a structure of another display substrate according to an exemplary embodiment of the present disclosure.

FIG. 15 is a schematic diagram of a structure of another display substrate according to an exemplary embodiment of the present disclosure, illustrating a structure of a drive circuit layer of one pixel unit (four sub-pixels) in a bottom emission display substrate. As shown in FIG. 15, a main body structure of the display substrate of this embodiment is substantially the same as that of the display substrate of the aforementioned embodiment, and a difference is that a first fracture K1 provided on a first scan signal line 41 is connected through a first signal connection electrode 91, and a second fracture K2 on a second scan signal line 42 is connected through a third signal connection electrode 93, a fourth signal connection electrode 94, and a fifth signal connection electrode 95.

In the exemplary implementation mode, structures of the first scan signal line 41, the first fracture K1, and the first signal connection electrode 91 may be substantially the same as those in the aforementioned embodiment.

In an exemplary implementation mode, the second scan signal line 42 is provided with the second fracture K2 that cuts off the second scan signal line 42, wherein the second fracture K2 may be arranged between a second sub-pixel P2 and a third sub-pixel P3; the fourth signal connection electrode 94 may be provided in the second sub-pixel P2; the fifth signal connection electrode 95 may be provided in the third sub-pixel P3; a first end of the third signal connection electrode 93 is connected with the fourth signal connection electrode 94 through a via on one hand, and is connected with a second scan signal line 42 on a side of the second fracture K2 and the second sub-pixel P2 through a via on the other hand; a second end of the third signal connection electrode 93 is connected with the fifth signal connection electrode 95 through a via on one hand, and is connected with a second scan signal line 42 on a side of the second fracture K2 and the third sub-pixel P3 through a via on the other hand, so that second scan signal lines 42 on both sides of the second fracture K2 are connected through the fourth signal connection electrode 94, the third signal connection electrode 93, and the fifth signal connection electrode 95, thereby achieving continuous transmission of a second scan signal.

In an exemplary implementation mode, the fourth signal connection electrode 94 and the fifth signal connection electrode 95 may be arranged in a same layer as a first power supply line 60, and a first scan signal line 41 and a second scan signal line 42 may be arranged in different layers from the first power supply line 60.

In an exemplary implementation mode, the third signal connection electrode 93 has a third length L3, and the third length L3 may be greater than a width M of the first power supply line 60.

In an exemplary implementation mode, the third length L3 of the third signal connection electrode 93 may be less than a width of a sub-pixel.

In an exemplary implementation mode, the third length L3 of the third signal connection electrode 93 may be about 50% to 80% of the width of the sub-pixel.

In the exemplary implementation mode, an orthographic projection of the third signal connection electrode 93 on the display substrate is not overlapped with orthographic projections of the first power supply line 60 and a data signal line 70 on the display substrate.

In an exemplary implementation mode, a compensation signal line 80 may be in a linear shape arranged continuously, and an orthographic projection of the compensation signal line 80 on the display substrate is at least partially overlapped with the orthographic projection of the third signal connection electrode 93 on the display substrate.

In an exemplary implementation mode, at least one through hole is provided on the third signal connection electrode 93, and an orthographic projection of the through hole on the display substrate is at least partially overlapped with an orthographic projection of the compensation signal line 80 on the display substrate.

In an exemplary implementation mode, in a direction perpendicular to the display substrate, the display substrate may include a transparent conductive layer, a first conductive layer, a first insulation layer, a semiconductor layer, a second insulation layer, a second conductive layer, a third insulation layer, and a third conductive layer which are stacked on a base substrate. The transparent conductive layer may at least include a first electrode plate of the storage capacitor, the first conductive layer may at least include a power supply connection line 21, a compensation connection line 22, a shield layer 23, and a third signal connection electrode 93, the semiconductor layer may at least include a second electrode plate of the storage capacitor and active layers of three transistors, the second conductive layer may at least include a first scan signal line 41, a second scan signal line 42, and gate electrodes of the three transistors, and the third conductive layer may at least include a first power supply line 60, a data signal line 70, a compensation signal line 80, first electrodes and second electrodes of the three transistors, a first signal connection electrode 91, a fourth signal connection electrode 94, and a fifth signal connection electrode 95.

In an exemplary implementation mode, the preparation process of the display substrate according to the exemplary implementation may include following operations.

(21) A pattern of a transparent conductive layer is formed. In an exemplary implementation mode, forming the pattern of the transparent conductive layer may be substantially the same as the act (11) of the aforementioned embodiment, and a structure of the transparent conductive layer which is formed is substantially the same as that of the transparent conductive layer of the aforementioned embodiment.

Figure 16:
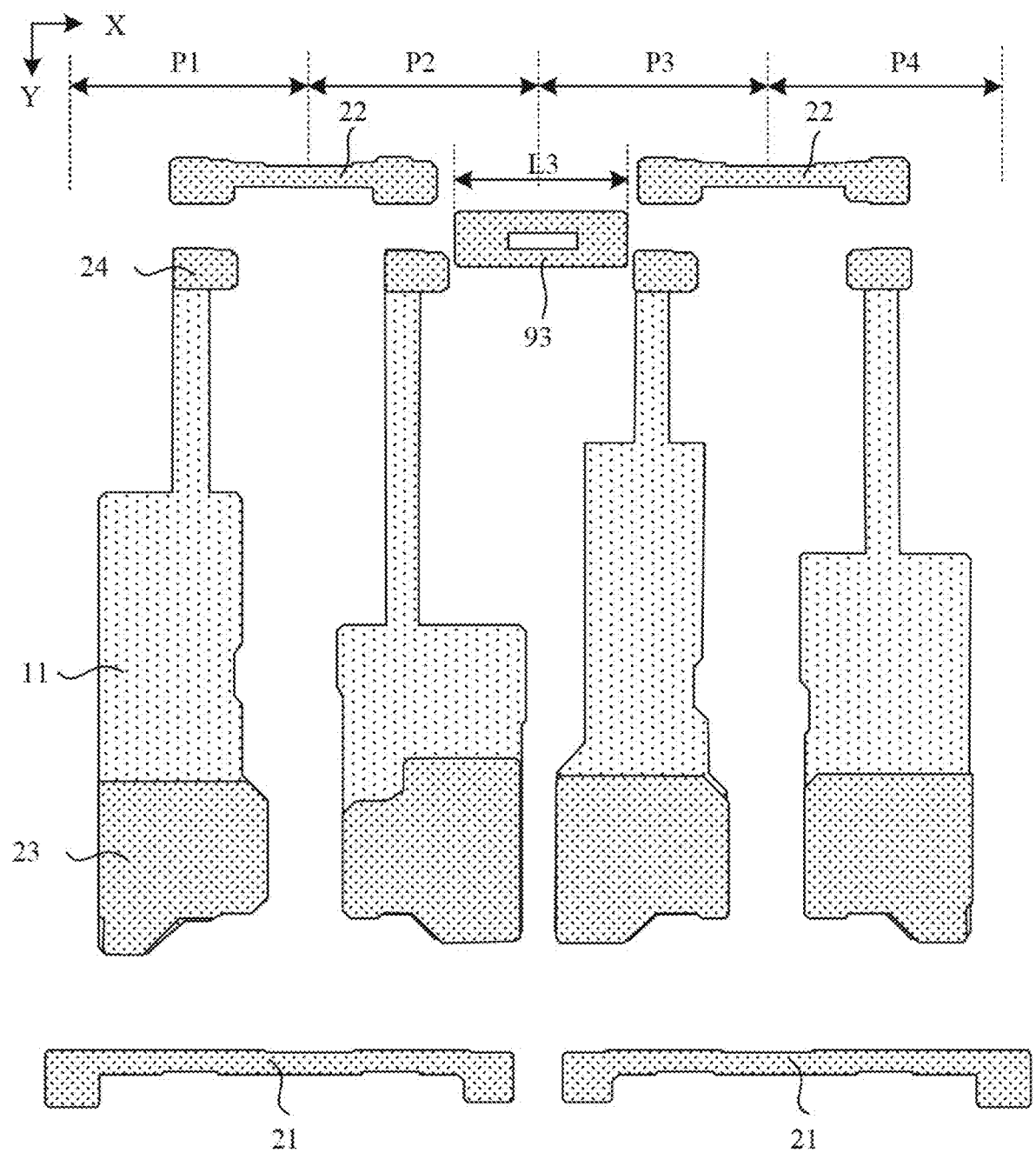
FIG. 16 is another schematic diagram after a pattern of a first conductive layer is formed according to an embodiment of the present disclosure.

(22) A pattern of a first conductive layer is formed. In an exemplary implementation mode, forming the pattern of the first conductive layer may be substantially the same as the act (12) of the aforementioned embodiment, and the pattern of the first conductive layer which is formed may at least include a power supply connection line 21, a compensation connection line 22, a shield layer 23, an interlayer connection electrode 24, and a third signal connection electrode 93, as shown in FIG. 16.

In the exemplary implementation mode, structures of the power supply connection line 21, the compensation connection line 22, the shield layer 23, and the interlayer connection electrode 24 are substantially the same as those of the aforementioned embodiments, and will not be repeated here.

In an exemplary implementation mode, a shape of the third signal connection electrode 93 may be a strip shape extending along a first direction X and may be arranged between a second sub-pixel P2 and a third sub-pixel P3, and the third signal connection electrode 93 is configured such that second scan signal lines formed subsequently on both sides of the second fracture are connected through a fourth signal connection electrode and a fifth signal connection electrode formed subsequently.

In an exemplary embodiment, the third signal connection electrode 93 may be provided with at least one through hole, and an orthographic projection of the through hole on a base substrate is at least partially overlapped with an orthographic projection of a compensation signal line formed subsequently on the base substrate to reduce a parasitic capacitance between the third signal connection electrode and the compensation signal line.

In an exemplary implementation mode, the third signal connection electrode 93 has a third length L3, and the third length L3 may be a dimension of the third signal connection electrode 93 in the first direction X, i.e., a dimension in an extending direction of the third signal connection electrode 93.

In an exemplary implementation mode, the third length L3 of the third signal connection electrode 93 may be greater than a width of a first power supply line 60 formed subsequently.

In an exemplary implementation mode, the third length L3 of the third signal connection electrode 93 may be less than a width of a sub-pixel.

In an exemplary implementation mode, the third length L3 of the third signal connection electrode 93 may be about 50% to 80% of the width of the sub-pixel.

Figure 17:
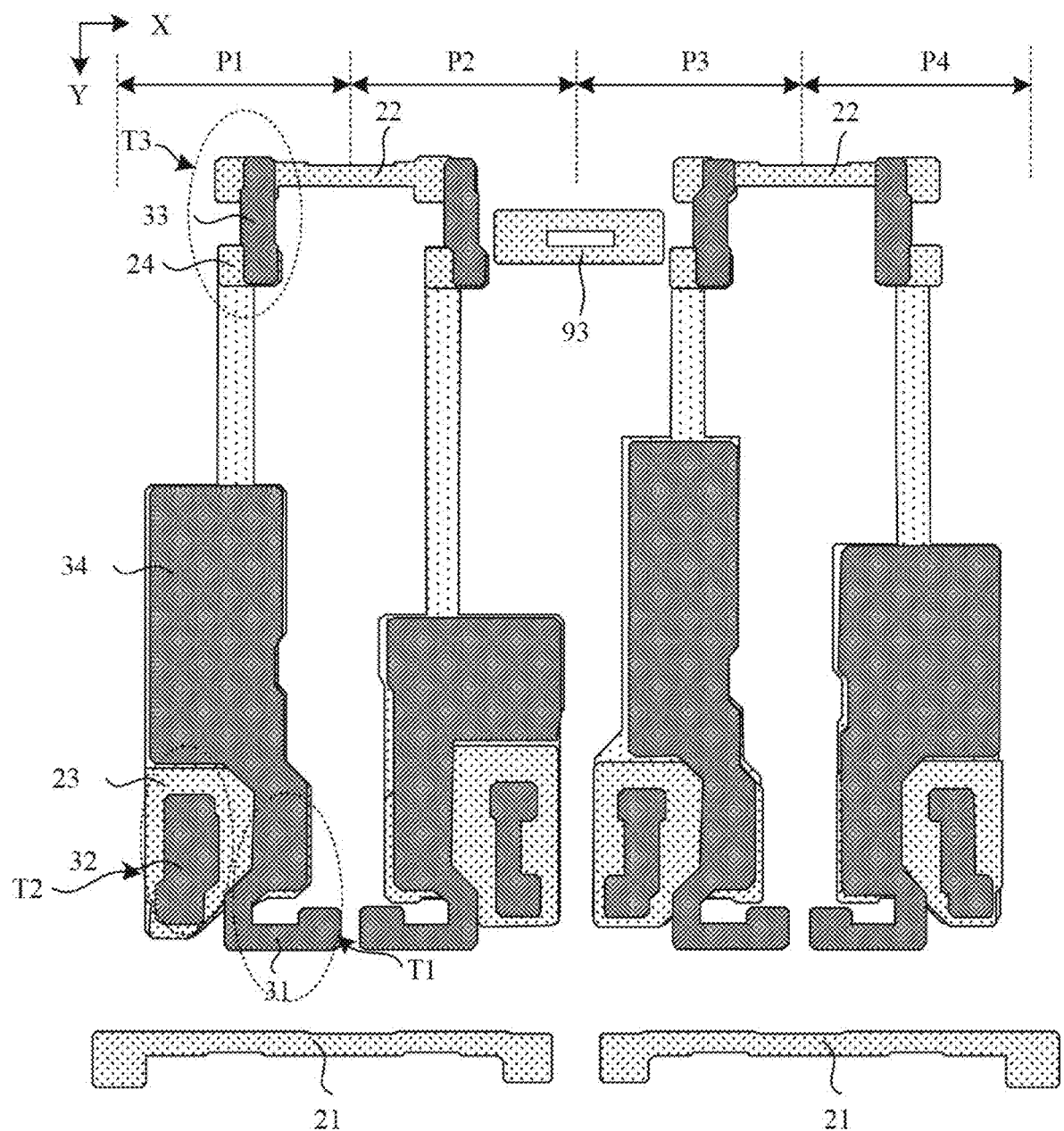
FIG. 17 is another schematic diagram after a pattern of a semiconductor layer is formed according to an embodiment of the present disclosure.

(23) A pattern of a semiconductor layer is formed. In an exemplary implementation mode, forming the pattern of the semiconductor layer may be substantially the same as the act (13) of the aforementioned embodiment, and a structure of the semiconductor layer which is formed is substantially the same as that of the semiconductor layer of the aforementioned embodiment, as shown in FIG. 17.

Figure 18:
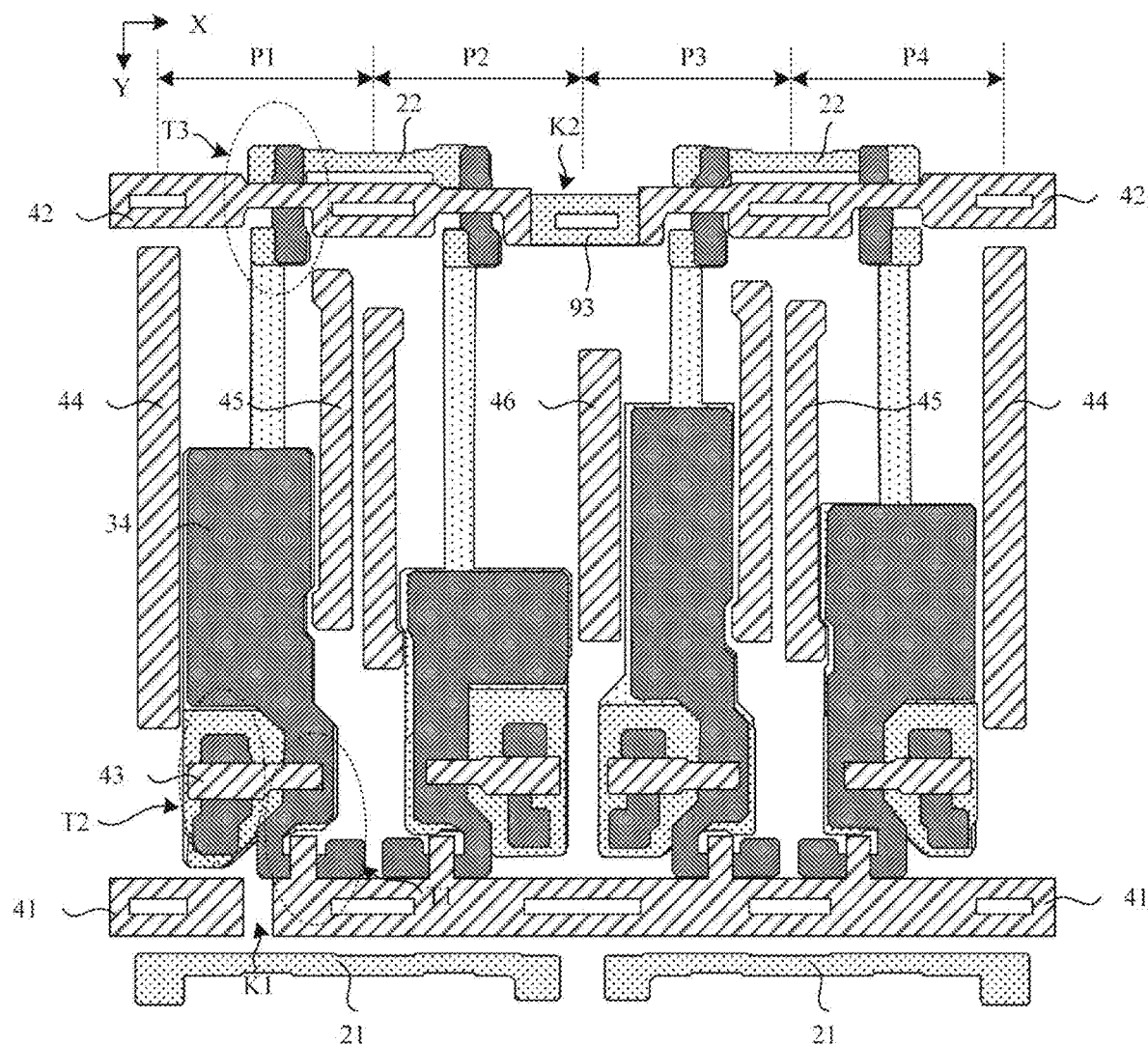
FIG. 18 is another schematic diagram after a pattern of a second conductive layer is formed according to an embodiment of the present disclosure.

(24) A pattern of a second conductive layer is formed. In an exemplary implementation mode, forming the pattern of the second conductive layer may be substantially the same as the act (14) of the aforementioned embodiment and a structure of the second conductive layer which is formed is substantially the same as that of the second conductive layer of the aforementioned embodiment, as shown in FIG. 18.

Figure 19:
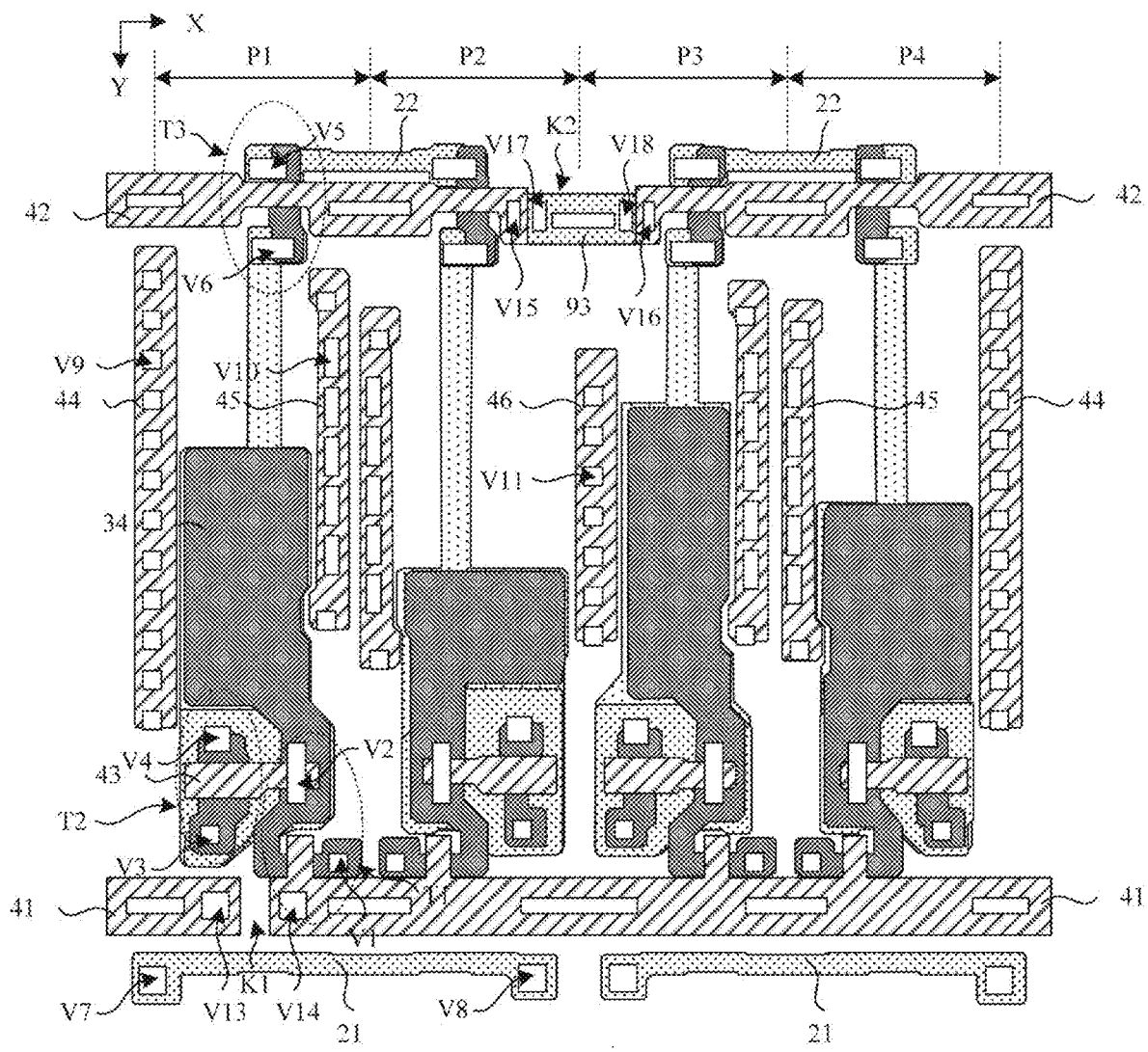
FIG. 19 is another schematic diagram after a pattern of a third insulation layer is formed according to an embodiment of the present disclosure.

(25) A pattern of a third insulation layer is formed. In an exemplary implementation mode, forming the pattern of the third insulation layer may be substantially the same as the act (15) of the aforementioned embodiment, and a plurality of vias which are formed at least include a first via V1 to an eleventh via V11, and a thirteenth via V13 to an eighteenth via V18, as shown in FIG. 19.

In the exemplary implementation mode, the first via V1 to the eleventh via V11 and the thirteenth via V13 to the fourteenth via V14 are substantially the same as those of the aforementioned embodiment.

In an exemplary embodiment, the fifteenth via V15 and the seventeenth via V17 may be provided in a second sub-pixel P2. An orthographic projection of the fifteenth via V15 on the base substrate may be located within a range of an orthographic projection of a second scan signal line 42 on one side of a second fracture K2 on the base substrate, and the third insulation layer within the fifteenth via V15 is etched away to expose a surface of the second scan signal line 42 on the one side of the second fracture K2. An orthographic projection of the seventeenth via V17 on the base substrate may be located within a range of an orthographic projection of the third signal connection electrode 93 on the base substrate, and the third insulation layer, the second insulation layer, and the first insulation layer within the seventeenth via V17 are etched away to expose a surface of the third signal connection electrode 93. The fifteenth via V15 and the seventeenth via V17 are configured such that a fourth signal connection electrode formed subsequently is connected with the third signal connection electrode 93 and the second scan signal line 42 on the one side of the second fracture K2 through the vias, respectively.

In an exemplary implementation mode, the sixteenth via V16 and the eighteenth via V18 may be provided in a third sub-pixel P3. An orthographic projection of the sixteenth via V16 on the base substrate may be located within a range of an orthographic projection of a second scan signal line 42 on the other side of the second fracture K2 on the base substrate, and the third insulation layer within the sixteenth via V16 is etched away to expose a surface of the second scan signal line 42 on the other side of the second fracture K2. An orthographic projection of the eighteenth via V18 on the base substrate may be located within a range of an orthographic projection of the third signal connection electrode 93 on the base substrate, and the third insulation layer, the second insulation layer, and the first insulation layer within the eighteenth via V18 are etched off to expose a surface of the third signal connection electrode 93. The sixteenth via V16 and the eighteenth via V18 are configured such that a fifth signal connection electrode formed subsequently is connected with the third signal connection electrode 93 and the second scan signal line 42 on the other side of the second fracture K2 through the vias, respectively.

Figure 20:
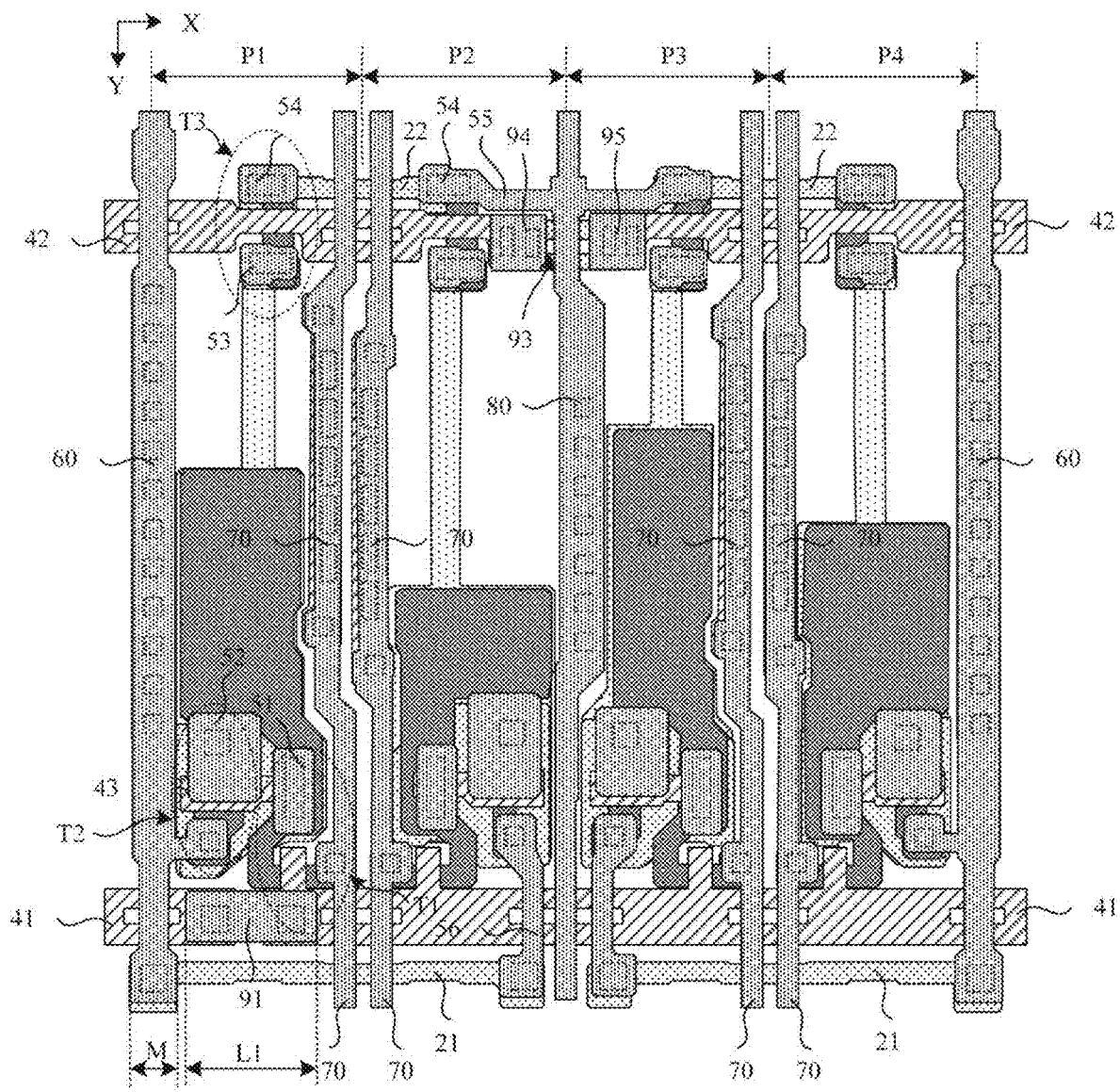
FIG. 20 is another schematic diagram after a pattern of a third conductive layer is formed according to an embodiment of the present disclosure.

(26) A pattern of a third conductive layer is formed. In an exemplary embodiment, forming the third conductive layer may be substantially the same as the act (16) of the aforementioned embodiment, a structure of the third conductive layer which is formed at least includes a first connection electrode 51, a second connection electrode 52, a third connection electrode 53, a fourth connection electrode 54, a fifth connection electrode 55, a sixth connection electrode 56, a first power supply line 60, a data signal line 70, a first signal connection electrode 91, a fourth signal connection electrode 94, and a fifth signal connection electrode 95, as shown in FIG. 20.

In the exemplary implementation mode, structures of the first connection electrode 51 to the sixth connection electrode 56, the first power supply line 60, the data signal line 70, the compensation signal line 80, and the first signal connection electrode 91 are substantially the same as those of the aforementioned embodiment, and will not be repeated here.

In an exemplary implementation mode, the fourth signal connection electrode 94 may be arranged in a second sub-pixel P2, the fifth signal connection electrode 95 may be arranged in a third sub-pixel P3, and shapes of the fourth signal connection electrode 94 and the fifth signal connection electrode 95 may be rectangular shapes. The fourth signal connection electrode 94 is connected with the second scan signal line 42 on one side of the second fracture K2 through the fifteenth via V15 on one hand, and is connected with the third signal connection electrode 93 through the seventeenth via V17 on the other hand, so that the second scan signal line 42 on the one side of the second fracture K2 and the third signal connection electrode 93 are connected through the fourth signal connection electrode 94. The fifth signal connection electrode 95 is connected with the second scan signal line 42 on the other side of the second fracture K2 through the sixteenth via V16 on one hand, and is connected with the third signal connection electrode 93 through the eighteenth via V18 on the other hand, so that the second scan signal line 42 on the other side of the second fracture K2 and the third signal connection electrode 93 are connected through the fifth signal connection electrode 95. In this way, second scan signal lines 42 on both sides of the second fracture K2 are connected through the fourth signal connection electrodes 94, the third signal connection electrodes 93, and the fifth signal connection electrodes 95.

In an exemplary implementation mode, the compensation signal line 80 is arranged between a second sub-pixel P2 and a third sub-pixel P3, a shape of the compensation signal line 80 may be a strip shape of which a main body portion extends along a second direction Y, and the compensation signal line 80 is of a continuous structure.

In an exemplary implementation mode, an orthographic projection of the compensation signal line 80 on the base substrate is at least partially overlapped with an orthographic projection of the third signal connection electrode 93 on the base substrate, the orthographic projection of the compensation signal line 80 on the base substrate is not overlapped with an orthographic projection of the fourth signal connection electrode 94 on the base substrate, and the orthographic projection of the compensation signal line 80 on the base substrate is not overlapped with an orthographic projection of the fifth signal connection electrode 95 on the base substrate.

(27) Patterns of a planarization layer, an anode conductive layer, a pixel definition layer, an organic emitting layer, a cathode, and an encapsulation structure layer are formed. In an exemplary embodiment, the patterns of the planarization layer, the anode conductive layer, the pixel definition layer, the organic emitting layer, the cathode, and the encapsulation structure layer which are formed may be substantially the same as those of the aforementioned embodiment, and will not be repeated here.

As shown in FIG. 16 to FIG. 20, the display substrate according to the exemplary embodiment of the present disclosure may include: a base substrate; a transparent conductive layer arranged on the base substrate, the transparent conductive layer at least including a first electrode plate 11; a first conductive layer arranged on the transparent conductive layer, the first conductive layer at least including a power supply connection line 21, a compensation connection line 22, a shield layer 23 which is connected with the first electrode plate 11, and a third signal connection electrode 93; a first insulation layer covering the first conductive layer; a semiconductor layer arranged on the first insulation layer, the semiconductor layer at least including a first active layer 31, a second active layer 32, a third active layer 33, and a second electrode plate 34, wherein the first active layer 31 and the second electrode plate 34 may be of an integral structure connected with each other, and the second electrode plate 34 and the first electrode plate 11 constitute a transparent storage capacitor; a second insulation layer covering the semiconductor layer; a second conductive layer arranged on the second insulation layer, the second conductive layer at least including a first scan signal line 41, a second scan signal line 42, and a second gate electrode 43, wherein at least one first fracture K1 is provided on the first scan signal line 41, and at least one second fracture K2 is provided on the second scan signal line 42; a third insulation layer covering the second conductive layer, a plurality of vias being provided on the third insulation layer; a third conductive layer arranged on the third insulation layer, the third conductive layer at least including a first power supply line 60, a data signal line 70, a first compensation signal line 81 and a second compensation signal line 81 of a compensation signal line, a first signal connection electrode 91, a fourth signal connection electrode 94, and a fifth signal connection electrode 95, wherein the first signal connection electrode 91 is connected with first scan signal lines 41 on both sides of the first fracture K1, and second scan signal lines 42 on both sides of the second fracture K2 are connected with each other through the fourth signal connection electrode 94, the third signal connection electrode 93, and the fifth signal connection electrode 95; a planarization layer which covers the third conductive layer, the planarization layer being provided with a plurality of vias; an anode conductive layer arranged on the planarization layer, the anode conductive layer at least including an anode; and a pixel definition layer, the pixel definition layer being provided with a pixel opening exposing the anode 301.

An exemplary embodiment of the present disclosure provides another display substrate in which a scan signal line is divided into a plurality of segments, wherein at least one first fracture is provided on a first scan signal line, first scan signal lines on both sides of the first fracture are connected with each other through a first signal connection electrode, at least one second fracture is provided on a second scan signal line, and second scan signal lines on both sides of the second fracture are connected with each other through a fourth signal connection electrode 94, a third signal connection electrode 93, and a fifth signal connection electrode 95, which not only effectively reduces an amount of static electricity generated by a scan signal line in a dry etching process, but also avoids a case of breakdown of a channel of a transistor caused by static electricity accumulation, effectively avoids occurrence of edge dark spots in a display apparatus, and improves a yield and display quality on a premise of ensuring continuous transmission of a scan signal.

The structure shown in the present disclosure and the preparation process thereof are merely exemplary description. In an exemplary implementation mode, corresponding structures may be changed and patterning processes may be added or reduced according to actual needs, which is not limited here in the present disclosure.

In an exemplary implementation mode, the display substrate according to the present disclosure may be applied to a display apparatus with a pixel drive circuit, such as an OLED, a Quantum dot display (QLED), a light emitting diode display (Micro LED or Mini LED), or a Quantum Dot Light Emitting Diode display (QDLED), which is not limited here in the present disclosure.

An exemplary embodiment of the present disclosure also provides a preparation method of a display substrate, and the display substrate may include a plurality of sub-pixels, and the preparation method may include following acts: forming a pixel drive circuit in at least one sub-pixel, wherein the pixel drive circuit is connected with a scan signal line extending along a first direction and a first power supply line extending along a second direction, the scan signal line is configured to provide a scan signal to the pixel drive circuit, the first power supply line is configured to provide a power supply signal to the pixel drive circuit, and the first direction intersects with the second direction; the scan signal line is provided with at least one fracture that cuts off the scan signal line, wherein scan signal lines on both sides of the fracture are connected with each other through a signal connection electrode, a length of the signal connection electrode is larger than a width of the first power supply line, the length of the signal connection electrode is smaller than a width of the sub-pixel, the length is a dimension of the signal connection electrode in the first direction, the width is a dimension of the first power supply line in the first direction, and the width of the sub-pixel is a dimension of the sub-pixel in the first direction X.

The present disclosure further provides a display apparatus including the display substrate of the aforementioned embodiment. The display apparatus may be any product or component with a display function, such as a mobile phone, a tablet computer, a television, a display, a laptop computer, a digital photo frame, and a navigator.

Although implementation modes disclosed in the present disclosure are described as above, the described contents are only implementation modes which are used for facilitating the understanding of the present disclosure, but are not intended to limit the present disclosure. Any skilled person in the art to which the present disclosure pertains may make any modification and variation in forms and details of implementation without departing from the spirit and scope of the present disclosure. However, the scope of patent protection of the present disclosure should be subject to the scope defined in the appended claims.

The invention claimed is:

1. A display substrate, comprising a plurality of sub-pixels, wherein at least one sub-pixel comprises a pixel drive circuit, the pixel drive circuit is connected with a scan signal line extending along a first direction and a first power supply line extending along a second direction, the scan signal line is configured to provide a scan signal to the pixel drive circuit, the first power supply line is configured to provide a power supply signal to the pixel drive circuit, and the first direction intersects with the second direction; and in at least one sub-pixel, the scan signal line is provided with at least one fracture that cuts off the scan signal line, scan signal lines on both sides of the fracture are connected with each other through a signal connection electrode, a length of the signal connection electrode is larger than a width of the first power supply line, and the length of the signal connection electrode is smaller than a width of the sub-pixel, wherein the length is a dimension of the signal connection electrode in the first direction, the width is a dimension of the first power supply line in the first direction, and the width of the sub-pixel is a dimension of the sub-pixel in the first direction X.

2. The display substrate according to claim 1, wherein the scan signal line comprises a first scan signal line that provides a first scan signal to the pixel drive circuit, the fracture comprises a first fracture that cuts off the first scan signal line, the signal connection electrode comprises a first signal connection electrode, a first end of the first signal connection electrode is connected with a first scan signal line on one side of the first fracture through a via, a second end of the first signal connection electrode is connected with a first scan signal line on the other side of the first fracture through a via, a length of the first signal connection electrode is larger than the width of the first power supply line, and the length of the first signal connection electrode is smaller than the width of the sub-pixel.

3. The display substrate according to claim 2, wherein the plurality of sub-pixels comprise a first sub-pixel, a second sub-pixel, a third sub-pixel, and a fourth sub-pixel which are arranged sequentially along the first direction, the first fracture and the first signal connection electrode are arranged within the first sub-pixel, or the first fracture and the first signal connection electrode are arranged within the second sub-pixel, or the first fracture and the first signal connection electrode are arranged within the third sub-pixel, or the first fracture and the first signal connection electrode are arranged within the fourth sub-pixel.

4. The display substrate according to claim 2, wherein on a plane perpendicular to the display substrate, the display substrate comprises a plurality of conductive layers, the first signal connection electrode and the first power supply line are arranged in a same conductive layer, and the first scan signal line and the first power supply line are arranged in different conductive layers.

5. The display substrate according to claim 1, wherein the scan signal line comprises a second scan signal line that provides a second scan signal to the pixel drive circuit, the fracture comprises a second fracture that cuts off the second scan signal line, the signal connection electrode comprises a second signal connection electrode, a first end of the second signal connection electrode is connected with a second scan signal line on one side of the second fracture through a via, a second end of the second signal connection electrode is connected with a second scan signal line on the other side of the second fracture through a via, a length of the second signal connection electrode is larger than the width of the first power supply line, and the length of the second signal connection electrode is smaller than the width of the sub-pixel.

6. The display substrate according to claim 5, wherein on a plane perpendicular to the display substrate, the display substrate comprises a plurality of conductive layers, the second signal connection electrode and the first power supply line are arranged in a same conductive layer, and the second scan signal line and the first power supply line are arranged in different conductive layers.

7. The display substrate according to claim 5, wherein the pixel drive circuit is further connected with a compensation signal line, and the compensation signal line is configured to provide a compensation signal to the pixel drive circuit; in at least one sub-pixel, the compensation signal line at least comprises a compensation connection electrode, and a first compensation signal line and a second compensation signal line which are arranged at intervals, wherein a first end of the compensation connection electrode is connected with the first compensation signal line through a via, and a second end of the compensation connection electrode is connected with the second compensation signal line through a via.

8. The display substrate according to claim 7, wherein an orthographic projection of the compensation connection electrode on the display substrate is at least partially overlapped with an orthographic projection of the second fracture on the display substrate.

9. The display substrate according to claim 7, wherein an orthographic projection of the compensation connection electrode on the display substrate is at least partially overlapped with an orthographic projection of the second signal connection electrode on the display substrate.

10. The display substrate according to claim 7, wherein at least one through hole is provided on the second signal connection electrode and an orthographic projection of the through hole on the display substrate is at least partially overlapped with an orthographic projection of the compensation connection electrode on the display substrate.

11. The display substrate according to claim 7, wherein the plurality of sub-pixels comprise a first sub-pixel, a second sub-pixel, a third sub-pixel, and a fourth sub-pixel which are arranged sequentially along the first direction, and the first compensation signal line, the second compensation signal line, and the compensation connection electrode are arranged between the second sub-pixel and the third sub-pixel.

12. The display substrate according to claim 1, wherein the scan signal line comprises a second scan signal line that provides a second scan signal to the pixel drive circuit, the fracture comprises a second fracture that cuts off the second scan signal line, the signal connection electrode comprises a third signal connection electrode, a fourth signal connection electrode, and a fifth signal connection electrode, a first end of the third signal connection electrode and a second scan signal line on one side of the second fracture are respectively connected with the fourth signal connection electrode through vias, a second end of the third signal connection electrode and a second scan signal line on the other side of the second fracture are respectively connected with the fifth signal connection electrode through vias, a length of the third signal connection electrode is larger than the width of the first power supply line, and the length of the third signal connection electrode is smaller than the width of the sub-pixel.

13. The display substrate according to claim 12, wherein on a plane perpendicular to the display substrate, the display substrate comprises a plurality of conductive layers, the fourth signal connection electrode, the fifth signal connection electrode, and the first power supply line are arranged in a same conductive layer, and the second scan signal line and the first power supply line are arranged in different conductive layers.

14. The display substrate according to claim 12, wherein the plurality of sub-pixels comprise a first sub-pixel, a second sub-pixel, a third sub-pixel, and a fourth sub-pixel which are arranged sequentially along the first direction, the fourth signal connection electrode is arranged within the second sub-pixel, and the fifth signal connection electrode is arranged within the third sub-pixel.

15. The display substrate according to claim 1, wherein the scan signal line comprises a first scan signal line that provides a first scan signal to the pixel drive circuit and a second scan signal line that provides a second scan signal to the pixel drive circuit, the fracture comprises a first fracture that cuts off the first scan signal line and a second fracture that cuts off the second scan signal line, the signal connection electrode comprises a first signal connection electrode and a second signal connection electrode, the first signal connection electrode is respectively connected with first signal connection electrodes on both sides of the first fracture through vias, and the second signal connection electrode is respectively connected with second signal connection electrodes on both sides of the second fracture through vias.

16. The display substrate according to claim 1, wherein the pixel drive circuit at least comprises a storage capacitor; and on a plane perpendicular to the display substrate, the display substrate comprises a transparent conductive layer, a first conductive layer, a semiconductor layer, a second conductive layer, and a third conductive layer which are arranged sequentially on a base substrate, wherein the transparent conductive layer at least comprises a first electrode plate of the storage capacitor, the semiconductor layer at least comprises a second electrode plate of the storage capacitor, the second conductive layer at least comprises the scan signal line, the third conductive layer at least comprises the first power supply line, the signal connection electrode is arranged in the third conductive layer, or the signal connection electrode is respectively arranged in the first conductive layer and the third conductive layer.

17. The display substrate according to claim 16, wherein the scan signal line comprises a first scan signal line, the signal connection electrode comprises a first signal connection electrode, the first scan signal line is arranged in the second conductive layer, and the first signal connection electrode is arranged in the third conductive layer.

18. The display substrate according to claim 15, wherein the scan signal line comprises a second scan signal line, the signal connection electrode comprises a third signal connection electrode, a fourth signal connection electrode, and a fifth signal connection electrode, the second scan signal line is arranged in the second conductive layer, the third signal connection electrode is arranged in the first conductive layer, and the fourth signal connection electrode and the fifth signal connection electrode are arranged in the third conductive layer.

19. A display apparatus, comprising the display substrate according to claim 1.

20. A preparation method of a display substrate, the display substrate comprising a plurality of sub-pixels, wherein the preparation method comprises:
    forming a pixel drive circuit in at least one sub-pixel, wherein the pixel drive circuit is respectively connected with a scan signal line extending along a first direction and a first power supply line extending along a second direction, the scan signal line is configured to provide a scan signal to the pixel drive circuit, the first power supply line is configured to provide a power supply signal to the pixel drive circuit, and the first direction intersects with the second direction; the scan signal line is provided with at least one fracture that cuts off the scan signal line, scan signal lines on both sides of the fracture are connected with each other through a signal connection electrode, a length of the signal connection electrode is larger than a width of the first power supply line, the length of the signal connection electrode is smaller than a width of the sub-pixel, the length is a dimension of the signal connection electrode in the first direction, the width is a dimension of the first power supply line in the first direction, and the width of the sub-pixel is a dimension of the sub-pixel in the first direction X.

\* \* \* \* \*